(12) United States Patent  (10) Patent No.: US 8,735,860 B2
Park et al.  (45) Date of Patent: May 27, 2014

(54) VARIABLE RESISTANCE MEMORY DEVICE AND METHOD OF FABRICATING THE SAME

(71) Applicants: Jintaek Park, Hwaseong-si (KR); Youngwoo Park, Seoul (KR); Jungdal Choi, Hwaseong-si (KR)

(72) Inventors: Jintaek Park, Hwaseong-si (KR); Youngwoo Park, Seoul (KR); Jungdal Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/742,598

(22) Filed: Jan. 16, 2013

(65) Prior Publication Data

US 2013/0285006 A1  Oct. 31, 2013

(30) Foreign Application Priority Data

Apr. 30, 2012  (KR) .......................... 10-2012-0045607

(51) Int. Cl.
  *H01L 29/02*  (2006.01)
(52) U.S. Cl.
  USPC ...................................... 257/2; 257/4; 257/5
(58) Field of Classification Search
  USPC .................................................... 257/2, 4, 5
  See application file for complete search history.

(56) References Cited

U.S. PATENT DOCUMENTS

| 7,952,163 | B2 | 5/2011 | Baek et al. |
| 2010/0207185 | A1 | 8/2010 | Lee et al. |
| 2010/0240205 | A1 | 9/2010 | Son et al. |
| 2010/0252909 | A1 | 10/2010 | Nakanishi et al. |
| 2011/0032772 | A1 | 2/2011 | Aritome |
| 2011/0199813 | A1 | 8/2011 | Yoo et al. |
| 2011/0241098 | A1 | 10/2011 | Park et al. |

FOREIGN PATENT DOCUMENTS

| KR | 10-2011-0099595 A | 9/2011 |
| KR | 10-2011-0108216 A | 10/2011 |
| KR | 10-2011-0111166 A | 10/2011 |
| KR | 10-2011-0111599 A | 10/2011 |

*Primary Examiner* — Tan N Tran
(74) *Attorney, Agent, or Firm* — Lee & Morse, P.C.

(57) ABSTRACT

A variable resistance memory device includes a selection transistor, which includes a first doped region and a second doped region, a vertical electrode coupled to the first doped region of the selection transistor, a bit line coupled to the second doped region of the selection transistor, a plurality of word lines stacked on the substrate along a sidewall of the vertical electrode, variable resistance patterns between the word lines and the vertical electrode, and an insulating isolation layer between the word lines. The variable resistance patterns are spaced apart from each other in a direction normal to a top surface of the substrate by the insulating isolation layer.

9 Claims, 50 Drawing Sheets

VARIABLE RESISTANCE MEMORY DEVICE AND METHOD OF FABRICATING THE SAME

CROSS-REFERENCE TO RELATED APPLICATION

The present application claims priority under 35 U.S.C. §119 to Korean Patent Application No. 10-2012-0045607, filed on Apr. 30, 2012, in the Korean Intellectual Property Office, and entitled: "Variable Resistance Memory Device and Method of Fabricating the Same," which is incorporated by reference herein in its entirety.

BACKGROUND

Next-generation semiconductor memory devices (e.g., a ferroelectric random access memory (FRAM), a magnetic random access memory (MRAM), a phase-change random access memory (PRAM), and so forth) are being developed in view of demands for high performance and low power consumption with respect to semiconductor memory devices. In the semiconductor memory devices, memory elements may be formed of non-volatile and variable resistance materials. For example, the memory element may exhibit an electric resistance, which may be selectively changed depending on a current or voltage applied thereto and may be preserved even when a current or voltage is not supplied.

SUMMARY

Embodiments may be realized by providing a variable resistance memory device that includes a selection transistor on a substrate, which selection transistor includes a first doped region and a second doped region, a vertical electrode coupled to the first doped region of the selection transistor, a bit line coupled to the second doped region of the selection transistor, a plurality of word lines stacked on the substrate along a sidewall of the vertical electrode, variable resistance patterns between the word lines and the vertical electrode, and an insulating isolation layer between the word lines. The variable resistance patterns may be spaced apart from each other in a direction normal to a top surface of the substrate by the insulating isolation layer.

The word lines may include a first word line and a second word line that are located at a same level from the top surface of the substrate and that are spaced apart from each other with the vertical electrode interposed therebetween. The variable resistance patterns may include first and second variable resistance patterns that are adjacent to the first and second word lines, respectively, and that are separated from each other. A dielectric constant of the insulating isolation layer may be less than a dielectric constant of the variable resistance patterns.

The device may include a bit line plug coupling the bit line with the second doped region. The bit line plug may be electrically separated from the word lines by the insulating isolation layer. The device may include a bit line plug coupling the bit line with the second doped region, and a first insulating layer between the bit line plug and the word lines.

The insulating isolation layer may be in contact with the first insulating layer. The sidewall of the vertical electrode may have recess regions between the variable resistance patterns, and the insulating isolation layer may extend into the recess regions. The device may include a protection insulating layer between the vertical electrode and the variable resistance patterns. The protection insulating layer may extend between the insulating isolation layer and the vertical electrode.

The device may include device isolation layers defining active regions of the substrate. The first doped region may be one of a plurality of first doped regions, the second doped region may be one of a plurality of second doped regions, and the first doped regions and the second doped regions may be alternatingly arranged between the device isolation layers.

The variable resistance patterns may include at least one selected from the group of a chalcogenide compound, a material that exhibits magneto-resistance characteristics, a perovskite compound, and a transition metal oxide.

Embodiments may also be realized by providing a method of fabricating a variable resistance memory device that includes forming a layered structure that includes first layers and second layers alternatingly stacked on a substrate, forming vertical structures that penetrate the layered structure, in which each of the vertical structures include a variable resistance layer and a vertical electrode, forming a first trench that penetrates the layered structure, removing the second layers exposed by the first trench to form exposed portions of the variable resistance layer, etching the exposed portions of the variable resistance layer to form variable resistance patterns that are spaced apart from each other in a direction normal to the substrate, and forming an insulating isolation layer to fill the first trench.

The method may include replacing the first layers of the layered structure that are exposed by the first trench with word lines. Forming the vertical structures may include forming a second trench to penetrate the layered structure, forming a first gap-filling layer to fill the second trench, forming through holes to penetrate the first gap-filling layer, and sequentially forming the variable resistance layer and the vertical electrode in the through holes.

The first gap-filling layer may include a same material as the insulating isolation layer, and the first gap-filling layer may be removed during the removing of the second layers exposed by the first trench.

The method may include removing the first gap-filling layer to expose portions of the variable resistance layer, etching the exposed portions of the variable resistance layer to form preliminary variable resistance patterns that are separated from each other in the direction normal to a top surface of the substrate, and forming a second gap-filling layer in a space, from which the first gap-filling layer is removed. The second gap-filling layer may be formed of a material having an etching selectivity with respect to the insulating isolation layer. The method may include forming bit line plugs extending through the insulating isolation layer to be connected to the substrate.

Embodiments may also be realized by providing a method of fabricating a variable resistance memory device that includes forming a first trench in a stacked structure on a substrate, providing a variable resistance layer on a sidewall of the first trench, providing a vertical electrode that is enclosed by the variable resistance layer, forming a second trench through which portions of the variable resistance layer are exposed, which second trench is spaced apart from the first trench, removing the portions of the variable resistance layer that are exposed through the second trench such that unexposed portions of the variable resistance layer remain to form discrete variable resistance patterns, and forming a continuous insulating isolation layer that abuts edges of each of the discrete variable resistance patterns.

Before forming the discrete variable resistance patterns, the method may include removing sacrificial layers of the stacked structure through the second trench to form recess regions, and filing the recess regions with conductive layers. The unexposed portions of the variable resistance layer may be covered by the conductive layers during removing of the portions of the variable resistance layer.

Before forming the continuous insulating isolation layer, the method may include removing mold layers of the stacked structure through the second trench to form second recess regions. The second recess regions may expose the edges of each of the discrete variable resistance patterns and sides of the conductive layers. Forming the continuous insulating isolation layer may include covering the sides of the conductive layers by filling the second recess regions. Forming the continuous insulating layer may include filling the second trench.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
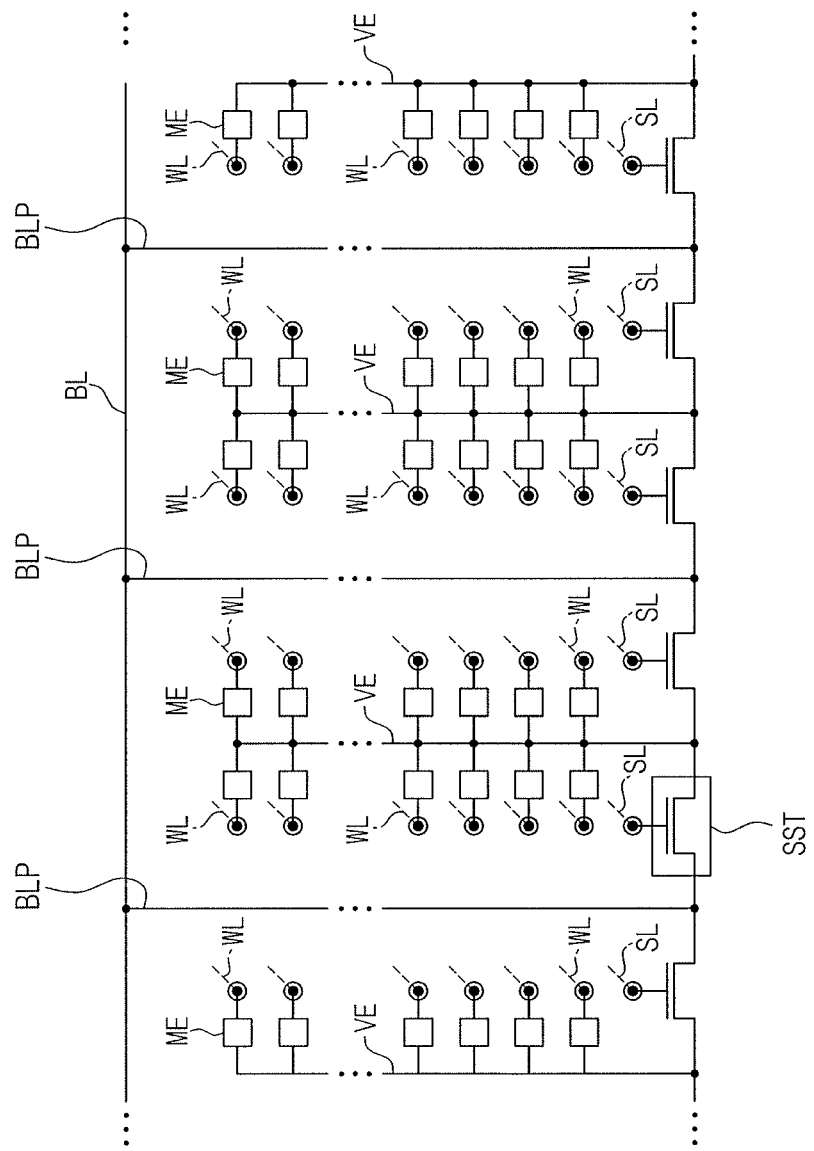
FIG. 1 illustrates a circuit diagram of a variable resistance memory device according to exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thicknesses of layers and regions are exaggerated for clarity. Like reference numerals in the drawings denote like elements, and thus their description will be omitted. It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of regions and/or structural elements may be reduced or exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 illustrates a circuit diagram of a variable resistance memory device according to exemplary embodiments.

Referring to FIG. 1, a plurality of bit line plugs BLP may be connected to first nodes of a plurality of selection transistors SST, respectively. The selection transistors SST may be connected in parallel to a bit line BL via the bit line plugs BLP. Each of the bit line plugs BLP may be connected in common to a pair of the selection transistors SST adjacent thereto.

A plurality of vertical electrodes VE may be connected to second nodes of the selection transistors SST. Each of the vertical electrodes VE may be connected in common to a pair of the selection transistors SST adjacent thereto. A plurality of word lines WL may be in parallel to the vertical electrodes VE, respectively. Variable resistance patterns ME may be provided between the word lines WL and the vertical electrodes VE. Each of the selection transistors SST may include a selection line SL serving as a gate electrode thereof. In example embodiments, the selection lines SL may be parallel to the word lines WL.

FIGS. 2 through 27B illustrate perspective views and sectional views depicting stages in a method of fabricating a variable resistance memory device according to exemplary embodiments.

Figure 2:
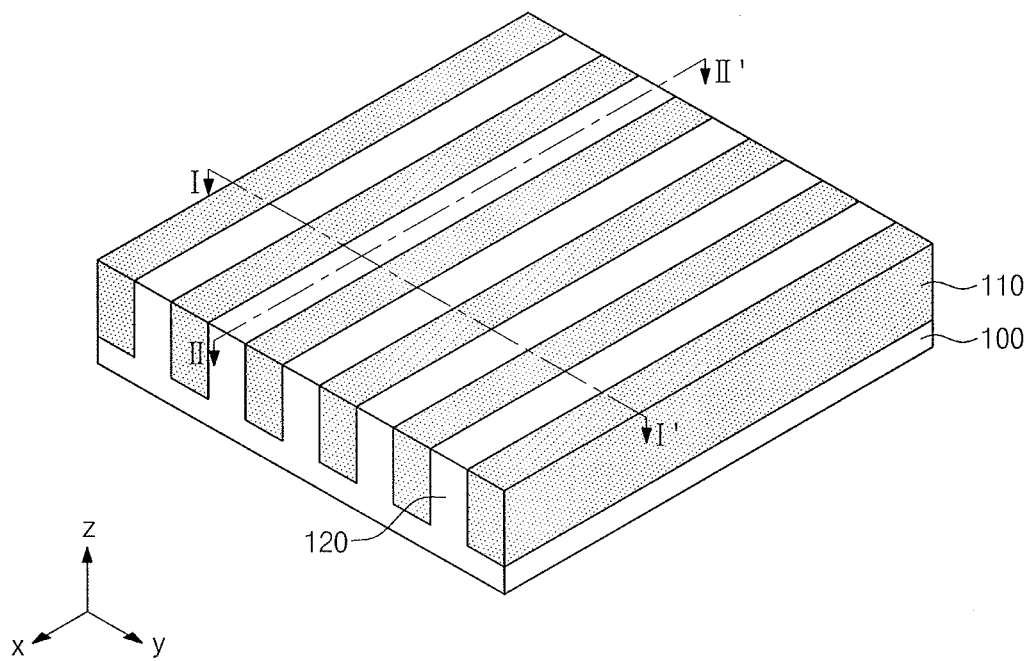
FIGS. 2, 3A, 3B, 4, 5A, 5B, 6, 7A, 7B, 8, 9A, 9B, 10, 11A, 11B, 12, 13A, 13B, 14, 15A, 15B, 16, 17A, 17B, 18, 19A, 19B, 20, 21A, 21B, 22, 23A, 23B, 24, 25A, 25B, 26, 27A, and 27B illustrate perspective views and sectional views depicting stages in methods of fabricating a variable resistance memory device according to exemplary embodiments.
Figure 3A:
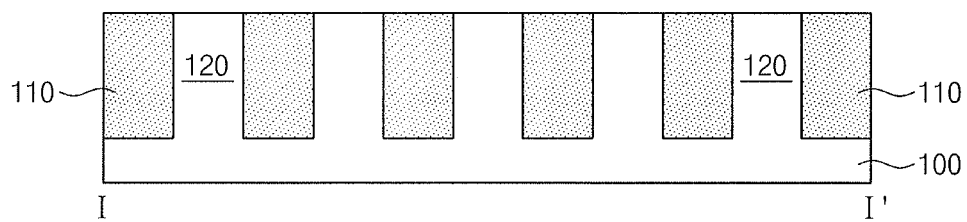
Figure 3B:
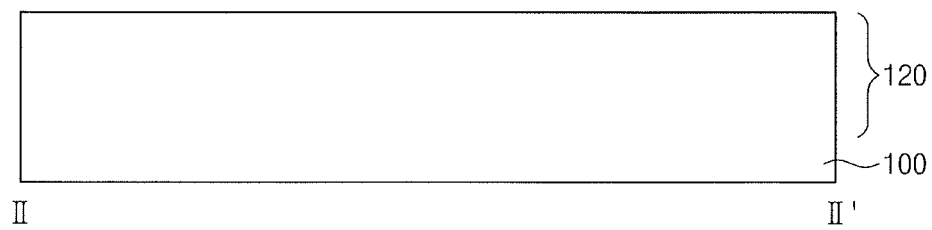

Referring to FIGS. 2, 3A, and 3B, a plurality of device isolation layers 110 may be formed on a substrate 100 to define active regions 120. FIGS. 3A and 3B are sectional views taken along lines I-I' and II-II', respectively, of FIG. 2. The substrate 100 may be formed to include at least one of semiconductors, insulators, conductors, or any combination thereof. In example embodiments, the substrate 100 may be a silicon wafer or a silicon-layer containing substrate. Each of the device isolation layers 110 may be a line-shaped pattern. The device isolation layers 110 may be parallel to each other, and thus, the active regions 120 defined by the device isolation layers 110 may also be parallel to each other.

Figure 4:
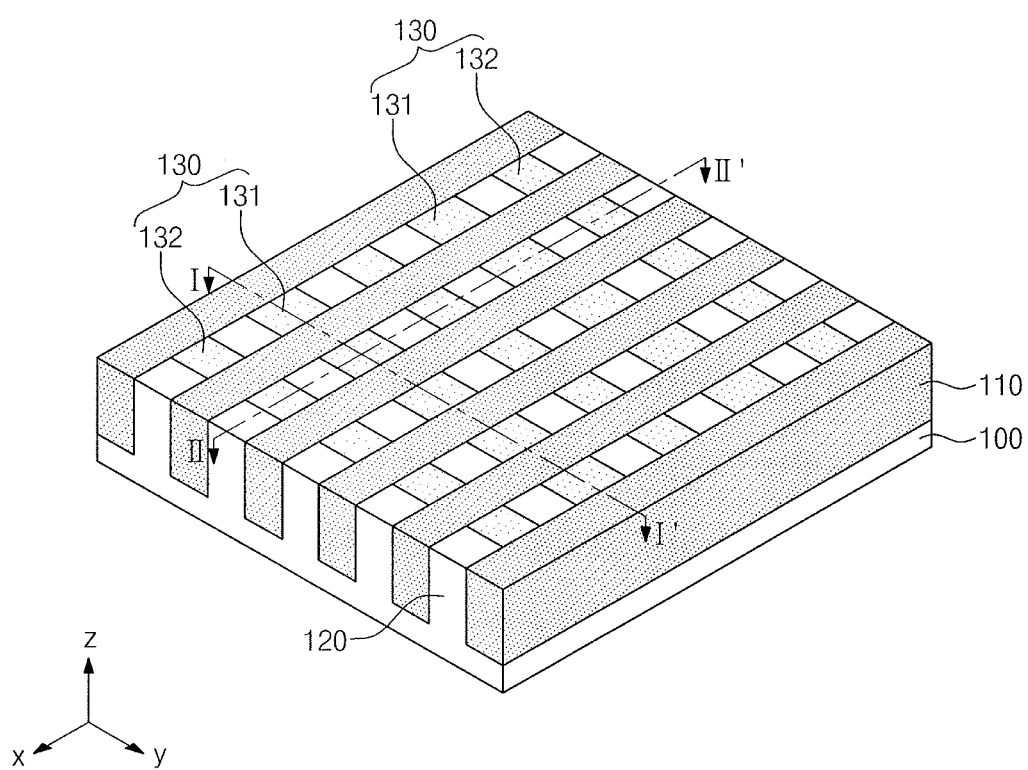
Figure 5A:
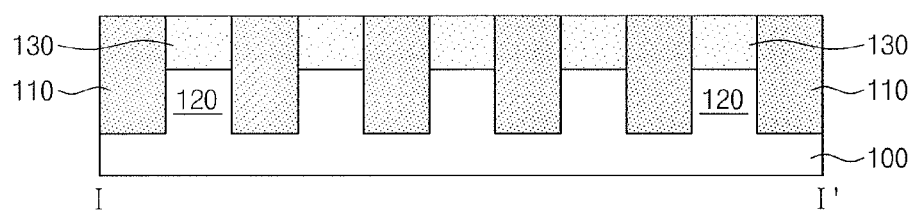
Figure 5B:
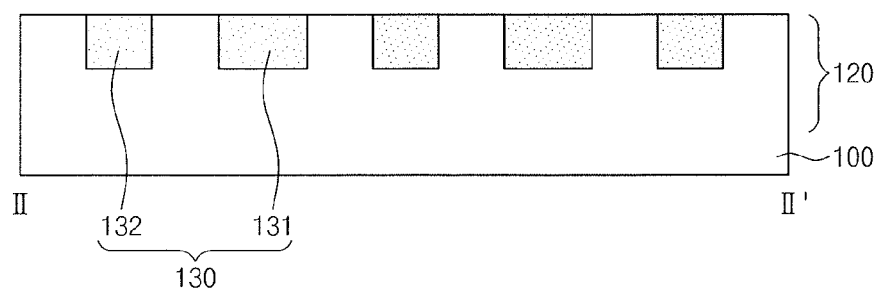

Referring to FIGS. 4, 5A, and 5B, doped regions 130 may be formed in upper portions of the active regions 120. FIGS. 5A and 5B are sectional views taken along lines I-I' and II-II' respectively, of FIG. 4. The doped regions 130 may include first doped regions 131 and second doped regions 132. The first doped regions 131 and the second doped regions 132 may be alternatingly arranged so as to be spaced apart from each other along an extending direction of the device isolation layers 110, e.g., along the x-axis direction. Along a y-axis direction, ones of the first doped regions 131 in different active regions 120 may be spaced apart from each other by the device isolation layers 110. Similarly, also along the y-axis direction, ones of the second doped regions 131 in different active regions 120 may be spaced apart from each other by the device isolation layers 110.

The first and second doped regions 131 and 132 may have the same conductivity type. Widths, e.g., along the x-axis direction, of the first doped regions 131 may be greater than widths of the second doped regions 132. However, embodiments are not limited thereto.

The formation of the doped regions 130 may include forming a mask pattern (not shown) on the device isolation layers 110 to cross the active regions 120 so that only parts of the active regions 120 are exposed. Then, performing an ion implantation process using the mask pattern as an ion mask. In other example embodiments, the doped regions 130 may be formed before the formation of the device isolation layers 110.

Figure 6:
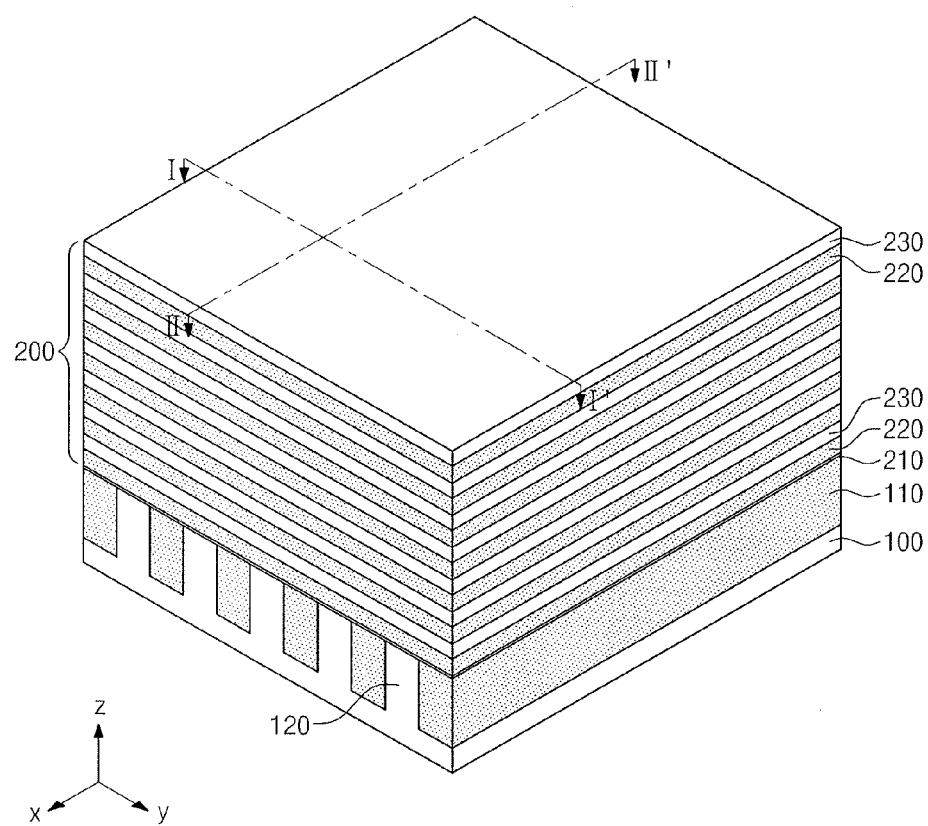
Figure 7A:
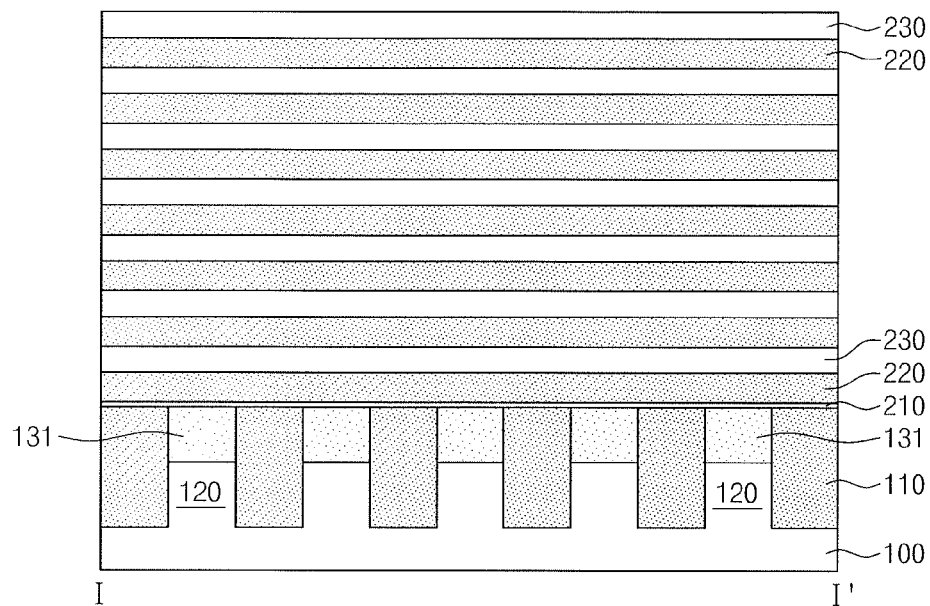
Figure 7B:
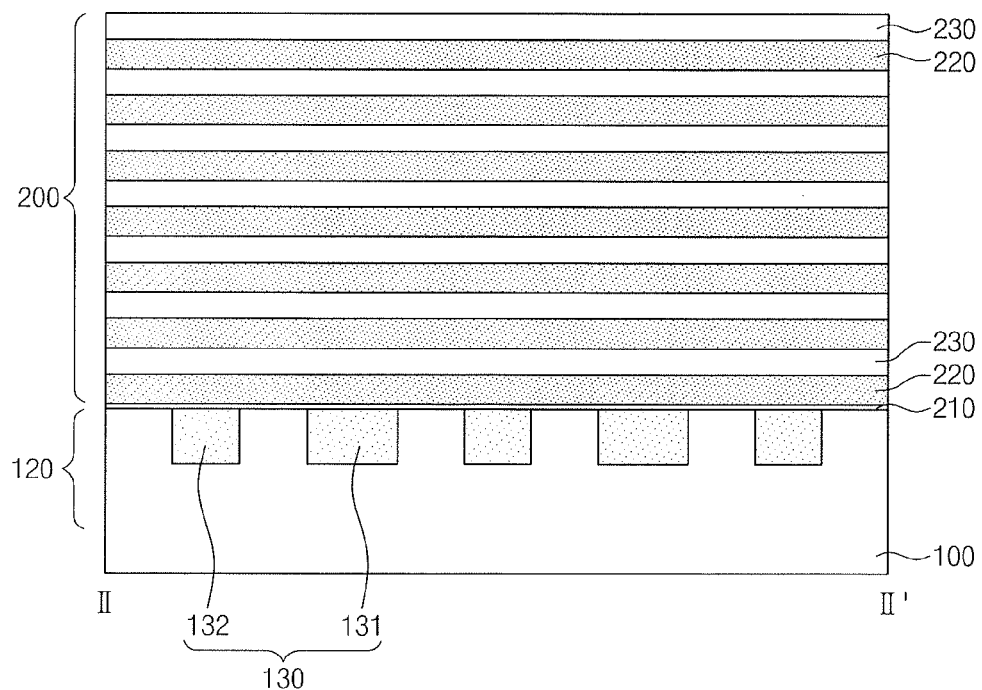

Referring to FIGS. 6, 7A, and 7B, a gate insulating layer 210 may be formed on the structure provided with the doped regions 130. The gate insulating layer 210 may include at least one of silicon oxide and high-k dielectrics. In example embodiments, the gate insulating layer 210 may be formed by thermally oxidizing a top surface of the active region 120. In another implementation, the gate insulating layer 210 may be a deposition layer formed using one of various deposition techniques.

A layered structure 200 may be formed on the gate insulating layer 210. FIGS. 7A and 7B are sectional views taken along lines I-I' and II-II', respectively, of FIG. 6. The layered structure 200 may include a plurality of sacrificial layers 220 and a plurality of mold layers 230 that may be alternatingly stacked on the gate insulating layer 210.

The sacrificial layers 220 may be formed of a material, which can be etched with an etch selectivity with respect to the mold layers 230. For example, a material for the sacrificial layer 220 may be selected to protect the mold layers 230 from being etched in a subsequent process of etching the sacrificial layer 220. The etching selectivity may be quantitatively expressed as a ratio of an etch rate of a material of the sacrificial layer 220 to an etch rate of a material of the mold layer 230. In example embodiments, the sacrificial layer 220 may be one or more materials providing an etch selectivity of about 1:10 to about 1:200, e.g., about 1:30 to about 1:100, with respect to one or more materials of the mold layer 230. For example, the mold layer 230 may be at least one of a silicon oxide and a silicon nitride, and the sacrificial layer 220 may be at least one of silicon, a silicon oxide, a silicon carbide, and silicon nitride. Whereas, the sacrificial layer 220 is selected to be a different material from the mold layer 230.

Figure 8:
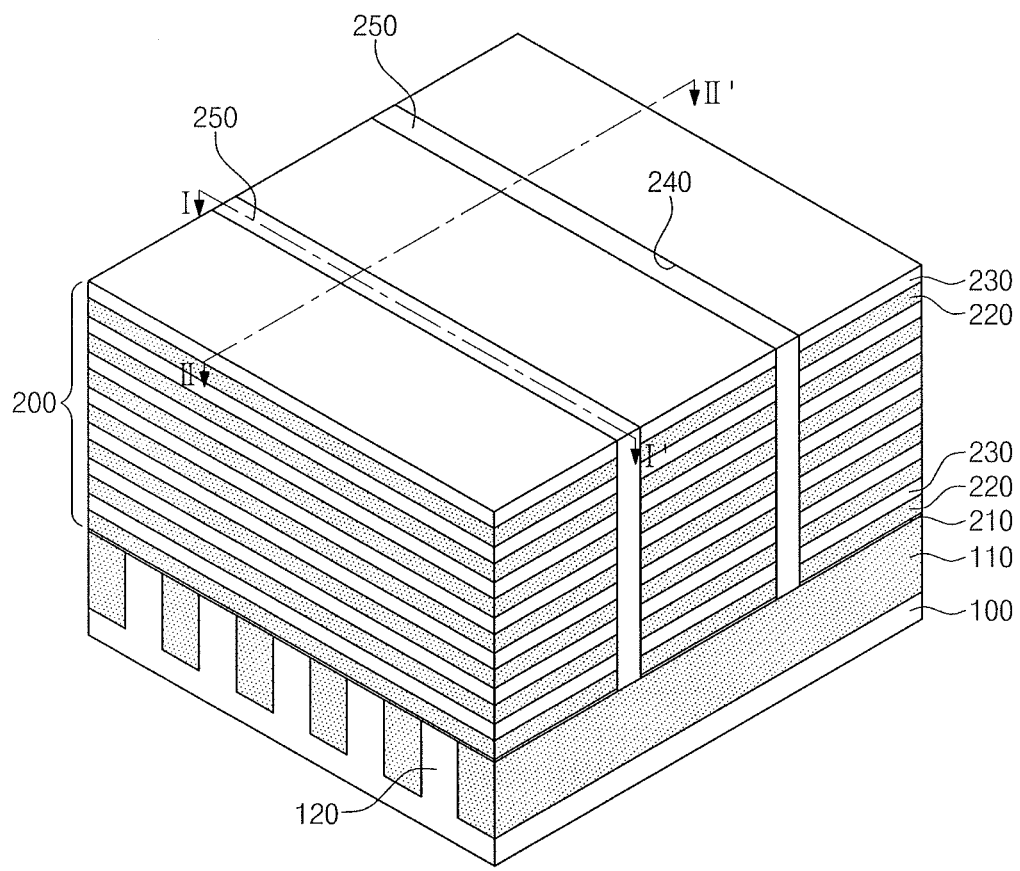
Figure 9A:
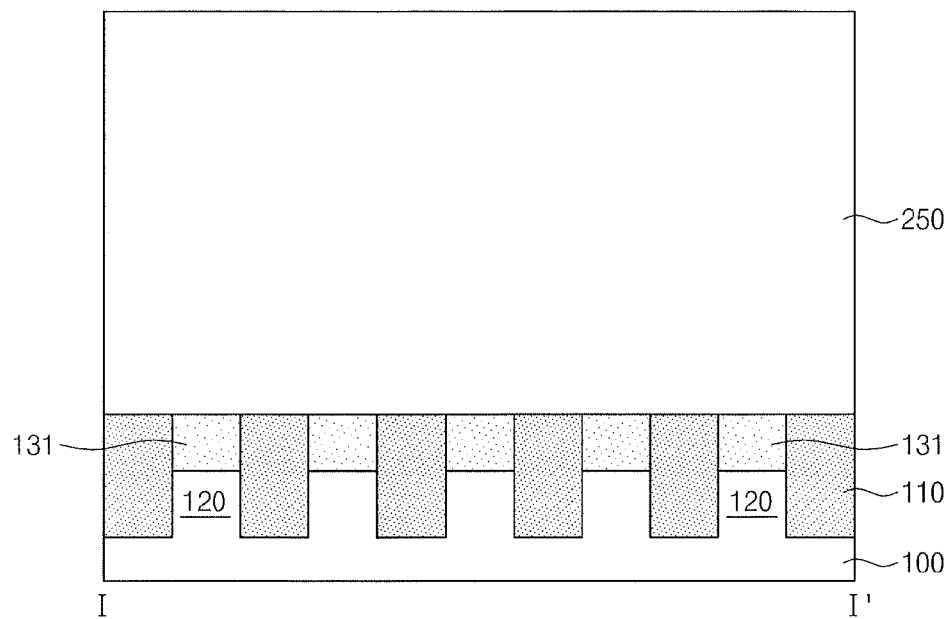
Figure 9B:
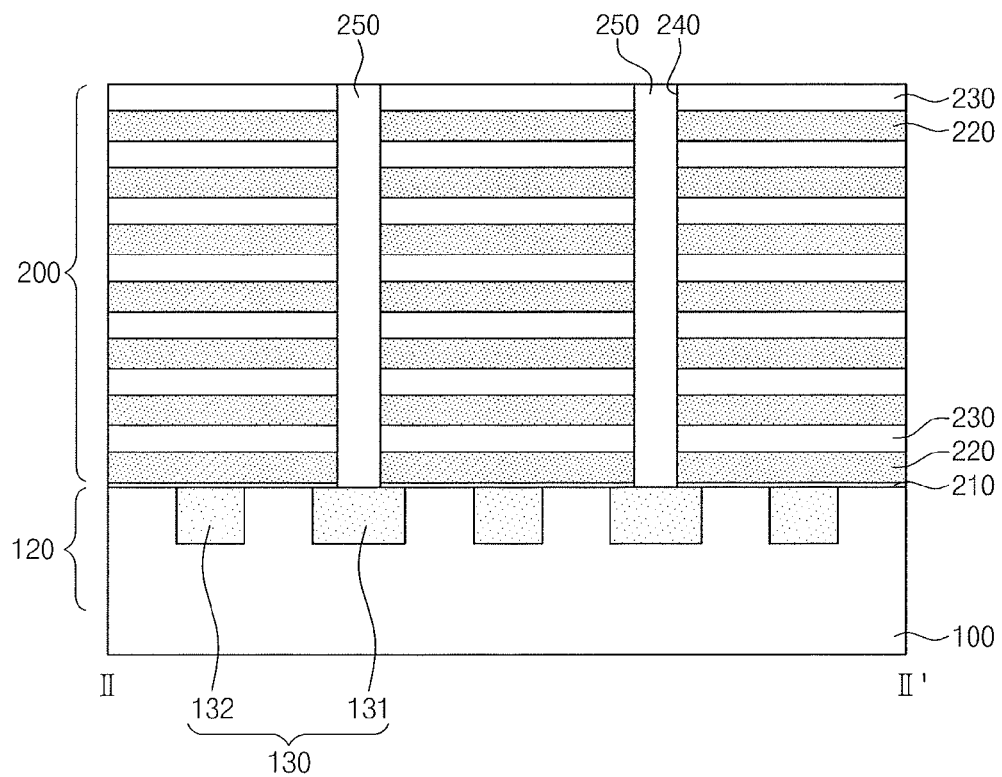

Referring to FIGS. 8, 9A, and 9B, the layered structure 200 may be patterned to form first trenches 240, e.g., the first trenches 240 may extend in the y-axis direction to overlap the device isolation layers 110 and the active regions 120. Then, first gap-filling layers 250 may be formed to fill the first trenches 240. FIGS. 9A and 9B are sectional views taken along lines I-I' and II-II' respectively, of FIG. 8.

Each of the first trenches 240 may be formed to expose ones the first doped regions 131 arranged along the y-axis direction and portions of the device isolation layers 110 therebetween. The gate insulating layer 210 may be removed during the process of forming the first trenches 240 so that each of the first doped regions 131 are exposed by one of the first trenches 240, which first doped regions 131 are then covered by the first gap-filling layers 250.

The first gap-filling layers 250 may include at least one of insulating materials. For example, the first gap-filling layers 250 may include at least one of a spin-on-glass (SOG) material and silicon oxide. In example embodiments, the first gap-filling layers 250 may be formed of the same material as the mold layers 230.

Figure 10:
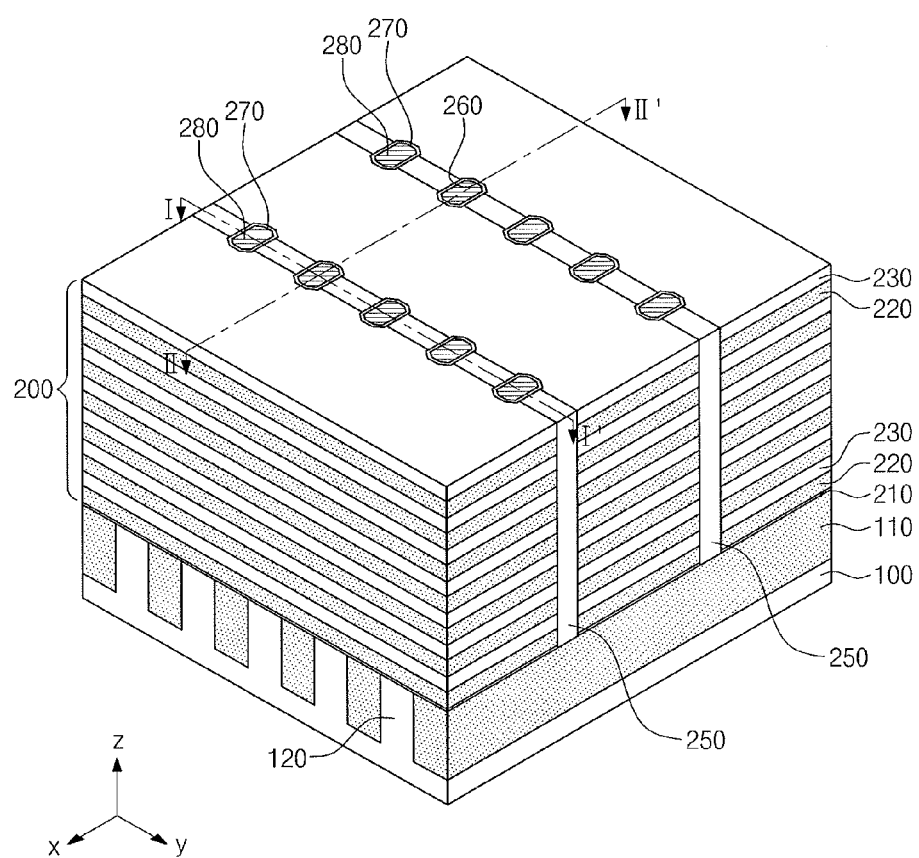
Figure 11A:
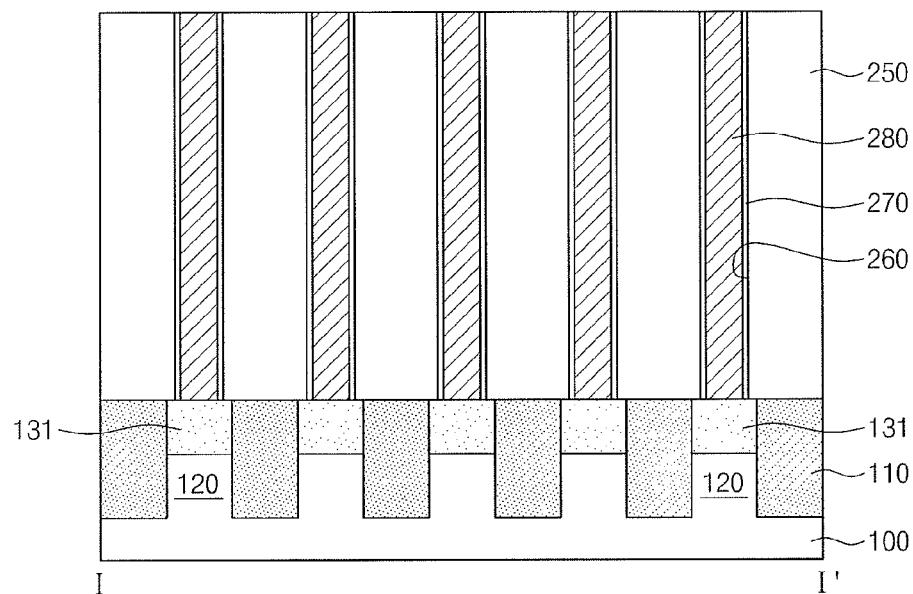
Figure 11B:
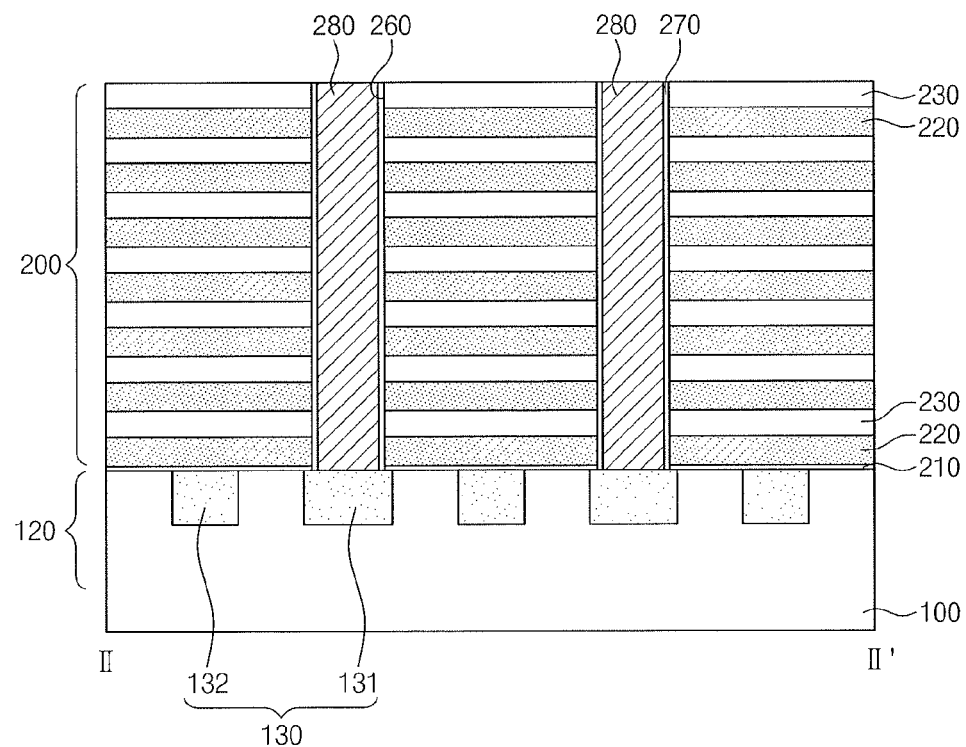

Referring to FIGS. 10, 11A, and 11B, vertical holes 260 may be formed in the first gap-filling layers 250 to expose the first doped regions 131 located below the first trenches 240, e.g., the vertical holes 260 may be formed so that the first doped regions 131 are selectively exposed while other regions remain covered by the first gap-filling layers 250. FIGS. 11A and 11B are sectional views taken along lines I-I' and II-II', respectively, of FIG. 10. A vertical structure may be formed in the vertical holes 260. The vertical structure may include variable resistance layers 270 covering inner sidewalls of the vertical holes 260 and vertical electrodes 280 filling the remaining spaces of the vertical holes 260. Each of the variable resistance layers 270 may enclose one of the vertical electrodes 280 therebetween, e.g., each variable resistance layer 270 may completely surround lateral sides of the vertical electrodes 280.

The vertical electrodes 280 may serve as the vertical electrodes VE of FIG. 1. In other example embodiments, the vertical electrodes 280 may be formed to partially fill the vertical holes 260, and an additional conductive layer (not shown) may be formed through the vertical electrodes 280 to be connected to the first doped regions 131. The additional conductive layer will be described in more detail with reference to FIGS. 28 through 31. The formation of the vertical holes 260 may include forming a mask pattern on the layered structure 200 and patterning the first gap-filling layers 250 using the mask pattern as an etch mask.

The variable resistance layer 270 may include at least one data-storing material. In example embodiments, the variable resistance layer 270 may include at least one of a perovskite compound and a conductive metal oxide. For example, the variable resistance layer 270 may include at least one of niobium oxide, titanium oxide, nickel oxide, zirconium oxide, vanadium oxide, PCMO((Pr,Ca)MnO$_3$), strontium-titanium oxide, barium-strontium-titanium oxide, strontium-zirconium oxide, barium-zirconium oxide, and barium-strontium-zirconium oxide.

In an exemplary implementation where the variable resistance layers 270 include a transition metal oxide, a dielectric constant of the variable resistance layers 270 may be greater than that of the silicon oxide layer. In other example embodiments, the variable resistance layers 270 may have a double-layered structure including a conductive metal oxide layer and a tunnel insulating layer, or a triple-layered structure including a first conductive metal oxide layer, a tunnel insulating layer, and a second conductive metal oxide. The tunnel insulating layer may include a layer of aluminum oxide, hafnium oxide, or silicon oxide.

In example embodiments, the variable resistance layer 270 may include at least one material (e.g., chalcogenides) whose electric resistance may be changed using thermal energy applied thereto. The chalcogenides may be a material including at least one of antimony (Sb), tellurium (Te), and selenium (Se). For example, the variable resistance layer 270 may include a chalcogenide formed of tellurium (Te) having about 20 to about 80 atomic percent concentration, antimony (Sb) having about 5 to about 50 atomic percent concentration, and germanium (Ge) having the remaining concentration. The chalcogenide for the variable resistance layer 270 may further include impurities of at least one of N, O, C, Bi, In, B, Sn, Si, Ti, Al, Ni, Fe, Dy, and La. In example embodiments, the variable resistance layer 270 may be formed of one of at least one of GeBiTe, InSb, GeSb, and GaSb.

The vertical electrodes 280 may include at least one of conductive materials, such as doped semiconductors, metals, conductive metal nitrides, and/or silicides. For example, the vertical electrodes 280 may include at least one of TiN, Wn, Pt, Au, and W.

According to an exemplary implementation where the variable resistance layers 270 are formed using a deposition technique, the variable resistance layers 270 may be formed to cover the first doped regions 131. Accordingly, before the formation of the vertical electrodes 280, an anisotropic etching process may be further performed to etch bottom portions of the variable resistance layers 270 and expose the first doped regions 131.

Figure 12:
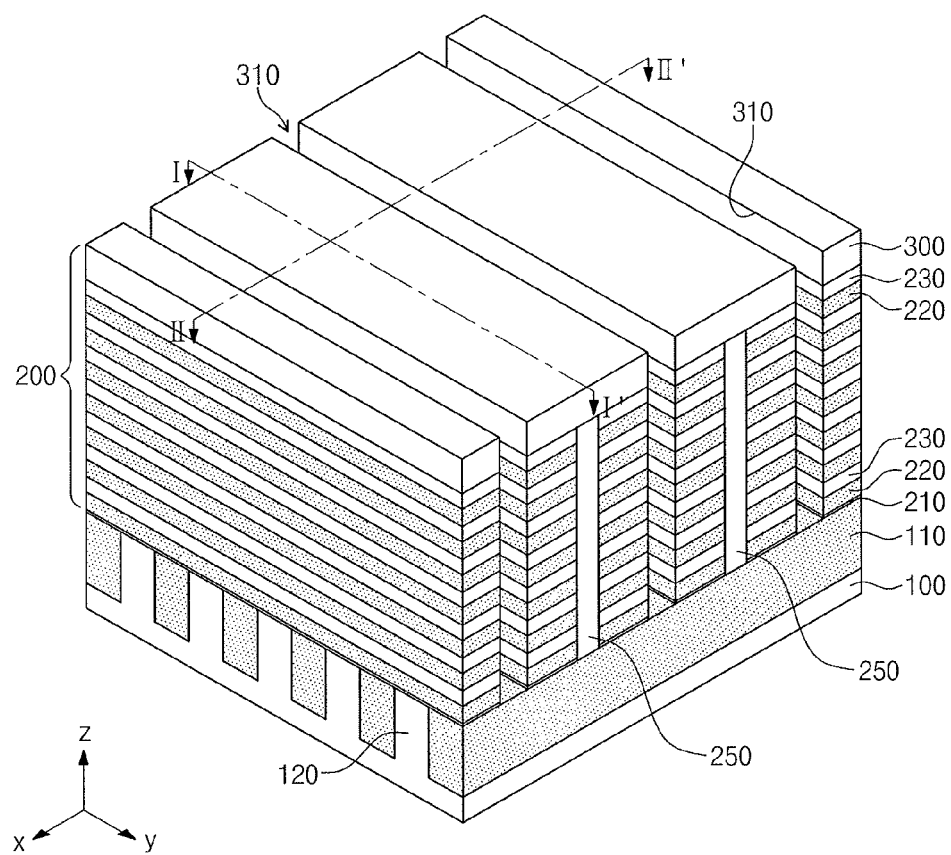
Figure 13A:
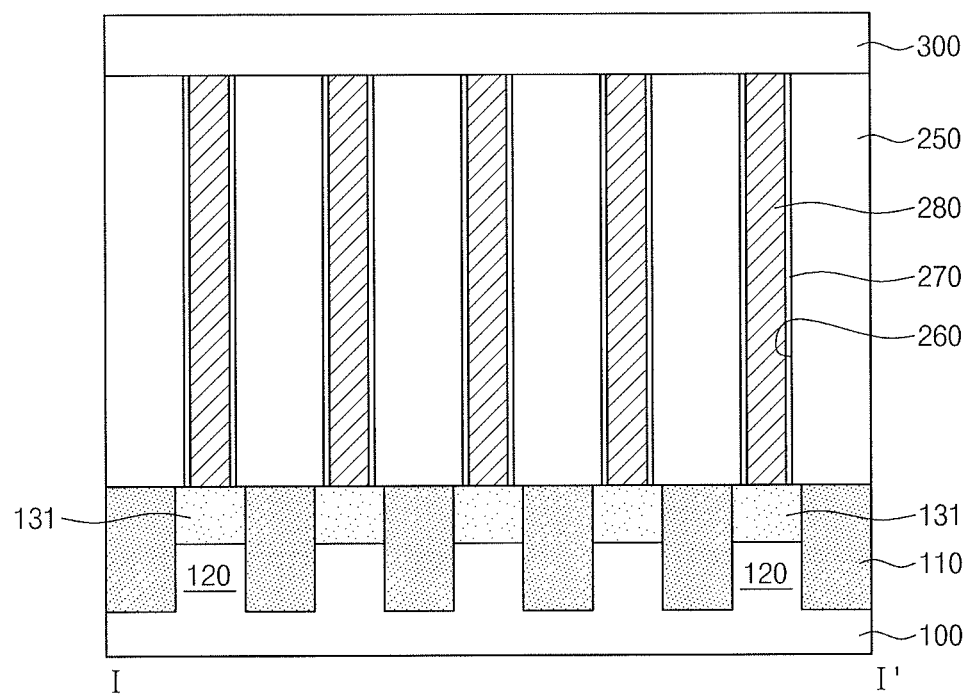
Figure 13B:
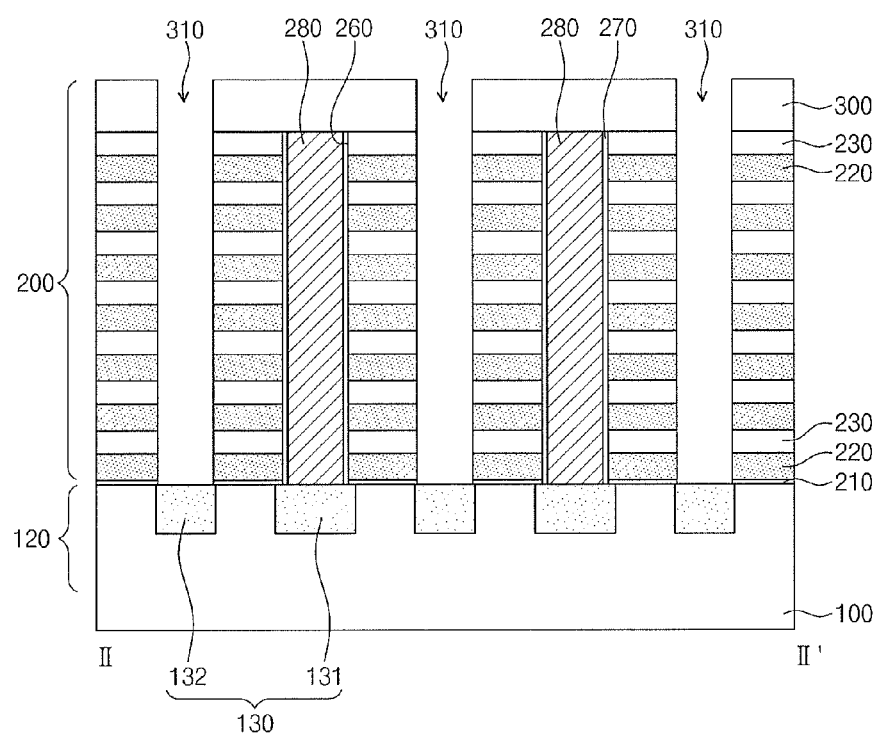

Referring to FIGS. 12, 13A, and 13B, the layered structure 200 may be patterned to form second trenches 310, e.g., along the y-axis direction, exposing the second doped regions 132. FIGS. 13A and 13B are sectional views taken along lines I-I' and II-II', respectively, of FIG. 12. The formation of the second trenches 310 may include forming a capping mask pattern 300 to cover the structure provided with the vertical electrodes 280, and then anisotropically etching the layered structure 200 using the capping mask pattern 300 as an etch mask. Each of the second trenches 310 may be formed to cross the device isolation layers 110. Sidewalls of the sacrificial layers 220 and the mold layers 230 may be exposed by the second trenches 310.

Figure 14:
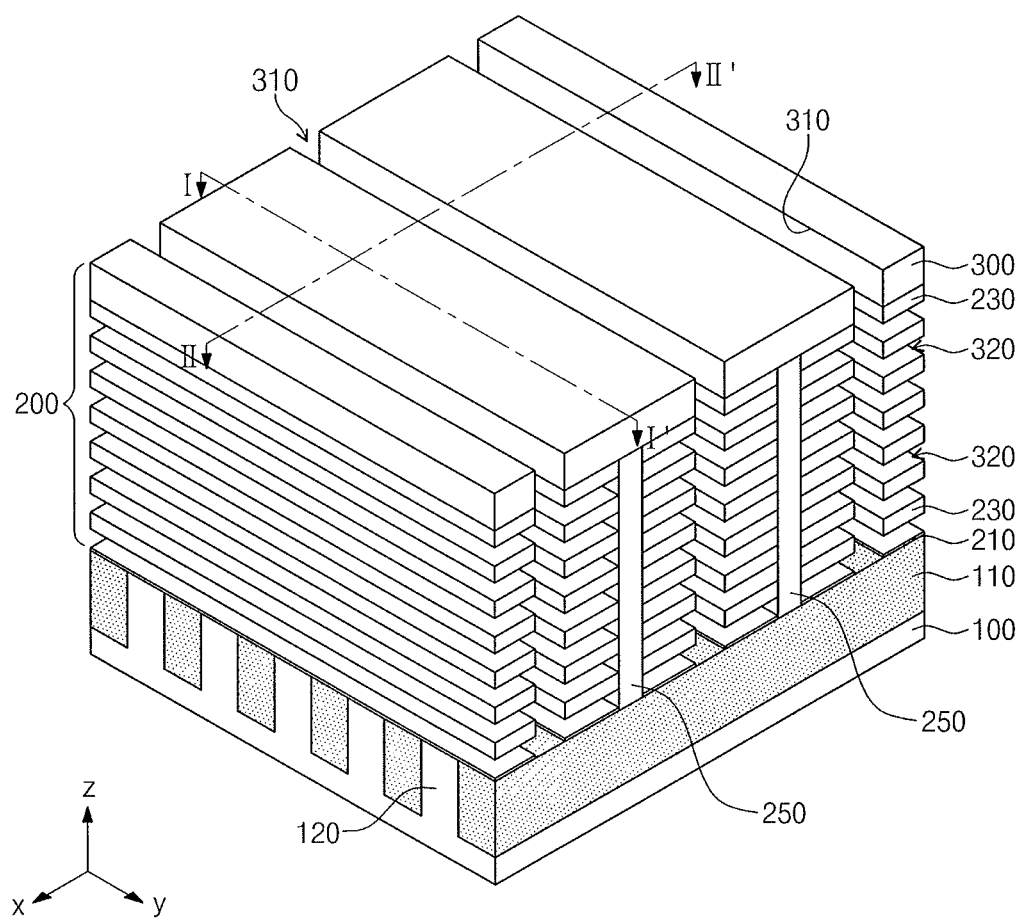
Figure 15A:
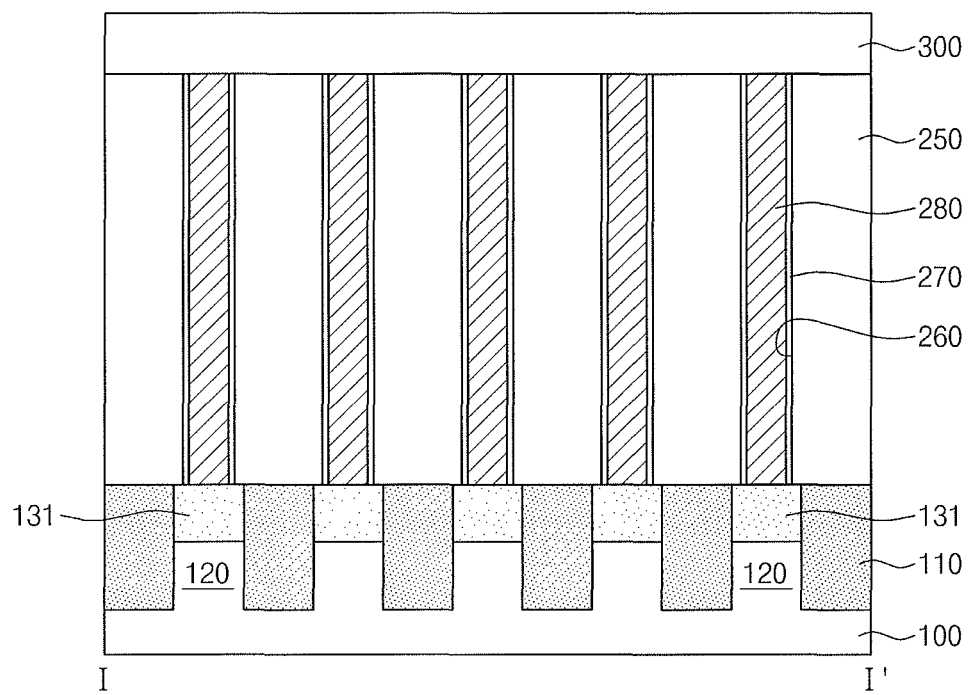
Figure 15B:
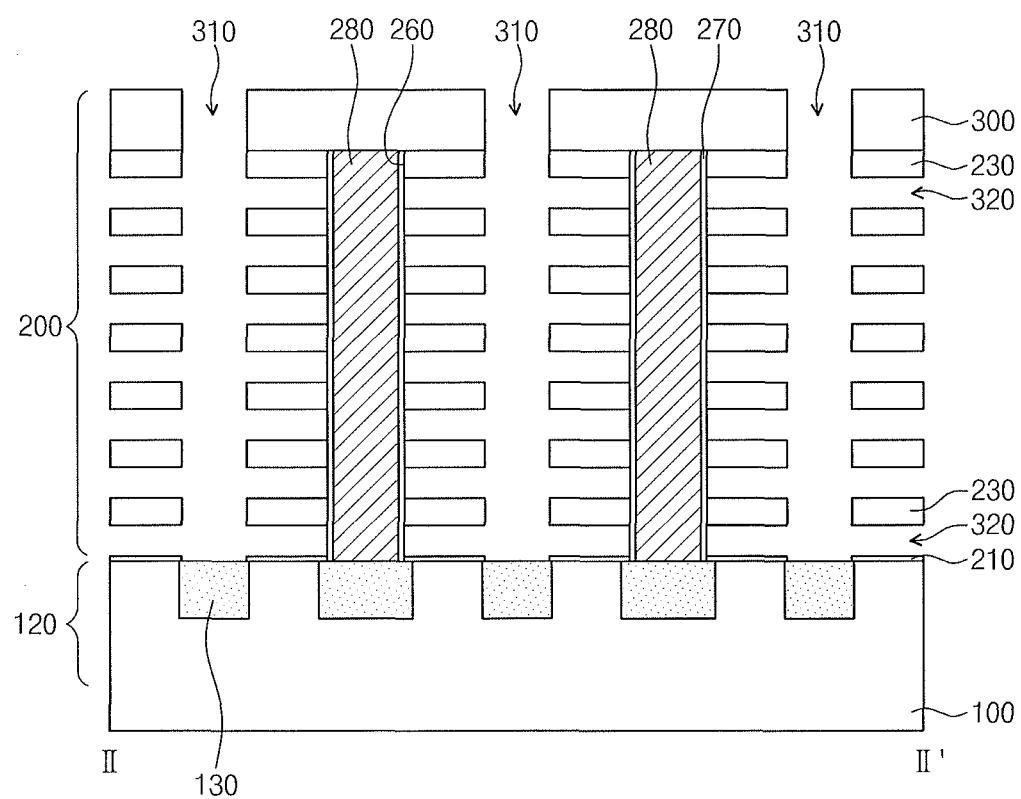

Referring to FIGS. 14, 15A, and 15B, the sacrificial layers 220 exposed by the second trenches 310 may be selectively removed to form recess regions 320 between the mold layers 230. FIGS. 15A and 15B are sectional views taken along lines I-I' and II-II', respectively, of FIG. 14. The recess regions 320 may expose outer sidewalls of the first gap-filling layers 250 and the variable resistance layers 270.

Figure 16:
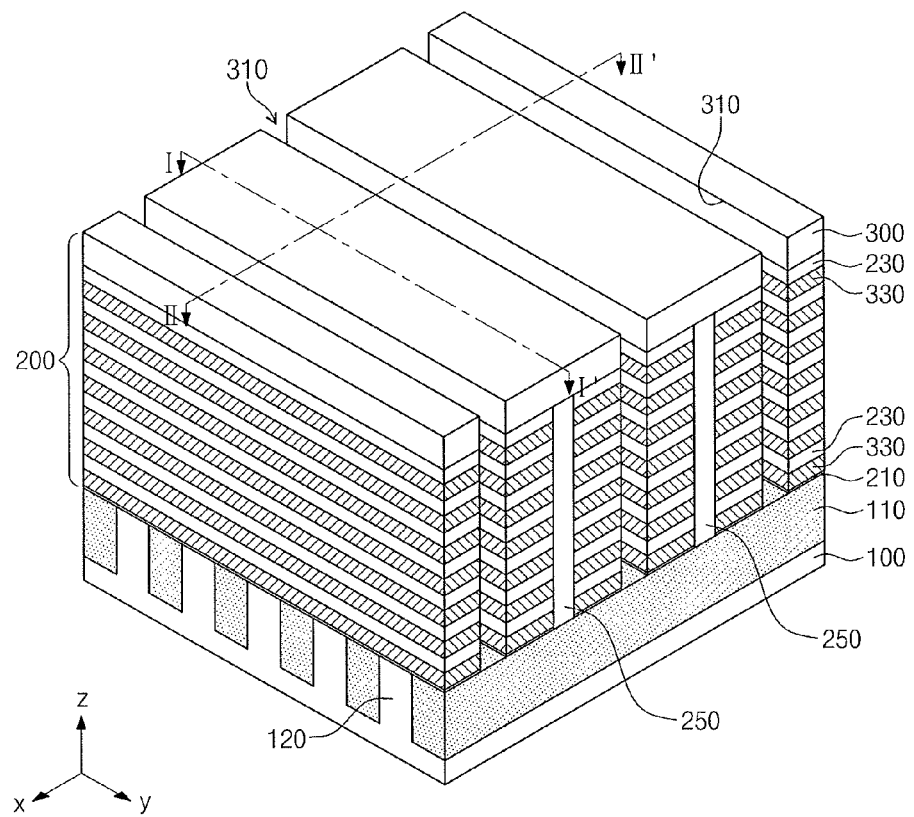
Figure 17A:
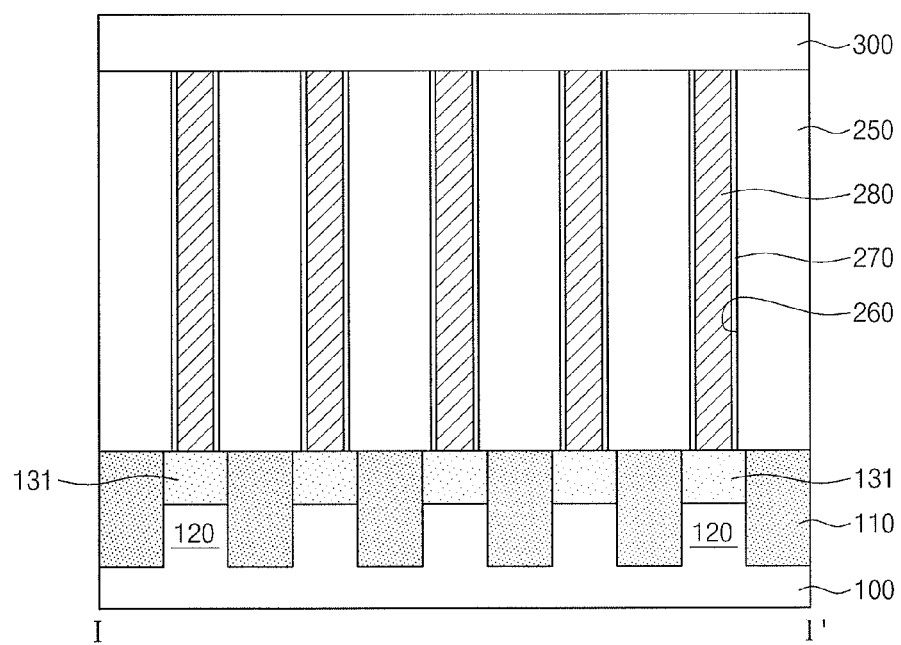
Figure 17B:
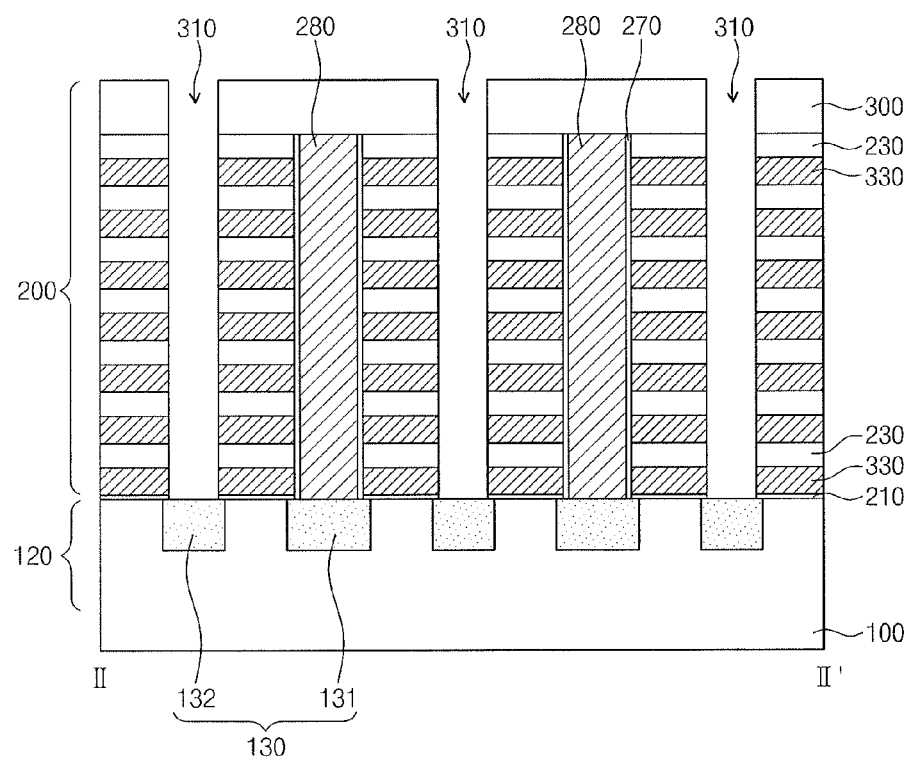

Referring to FIGS. 16, 17A, and 17B, horizontal electrodes 330 may be formed to fill the recess regions 320. FIGS. 17A and 17B are sectional views taken along lines I-I' and II-II', respectively, of FIG. 16. The horizontal electrodes 330 may serve as the word lines WL and/or the selection line SL, which are described with reference to FIG. 1.

The formation of the horizontal electrodes 330 may include forming a conductive layer to fill the recess regions 320 and removing the conductive layer from the second trench 310 to localize the conductive layer into internal spaces of the recess regions 320. In example embodiments, the conductive layer may be formed not to fill the whole region of the second trench 310. For example, the conductive layer may be formed to cover conformally an inner surface of the second trench 310. In this case, the removal of the conductive layer may be performed using an isotropic etching process (for example, a wet etching process). The horizontal electrodes 330 may include at least one of conductive materials. For example, the horizontal electrodes 330 may be formed of doped semiconductors, metals, and/or metal nitrides. In example embodiments, the horizontal electrodes 330 may include at least one of TiN, W, WN, Pt, and Au.

In other example embodiments, in the case where conductive layers are formed to replace the sacrificial layers 220 described with reference to FIGS. 6 and 7, the steps of forming the recess regions 320 and filling the recess regions 320 with the conductive layer may be omitted.

Figure 18:
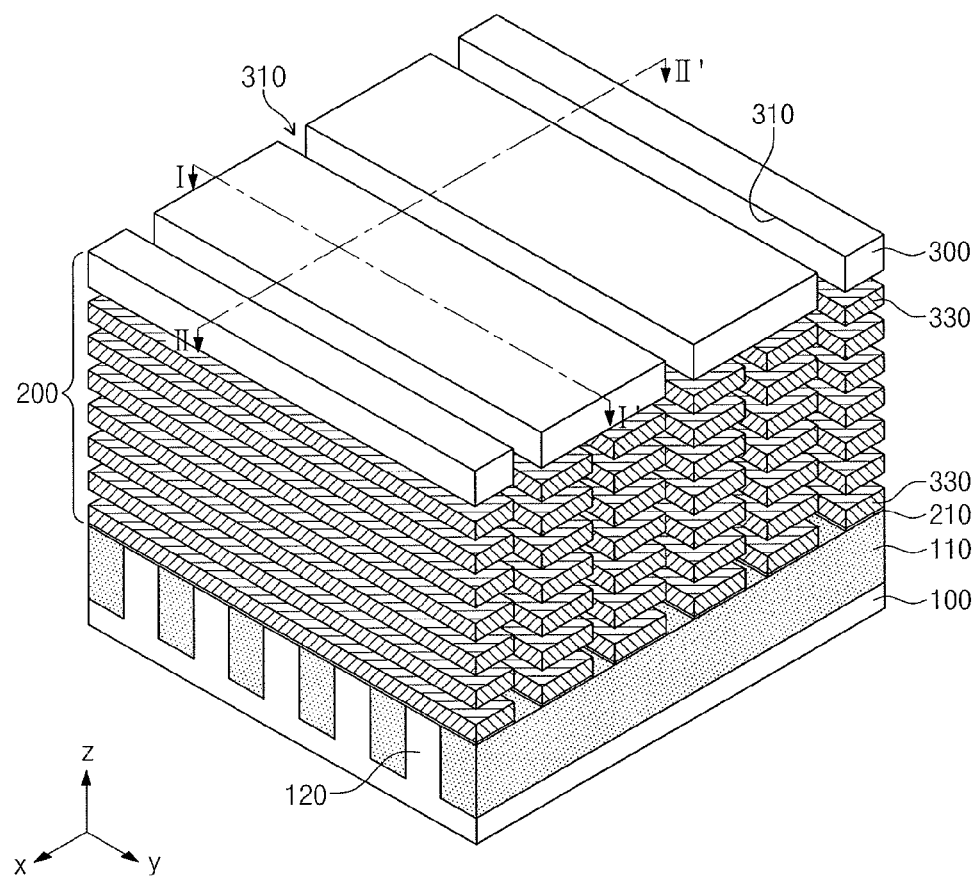
Figure 19A:
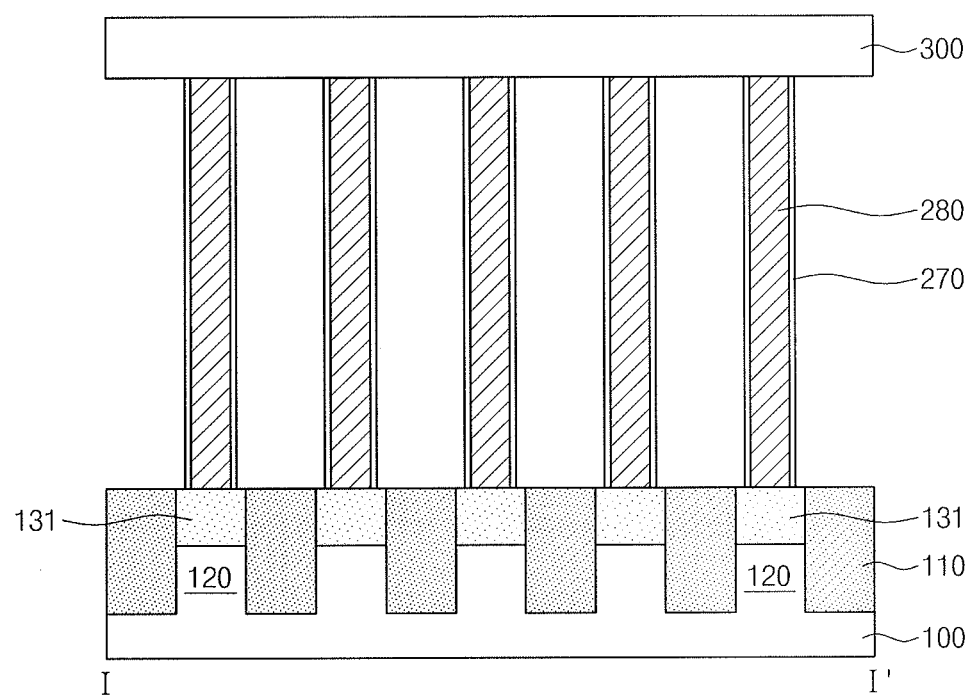
Figure 19B:
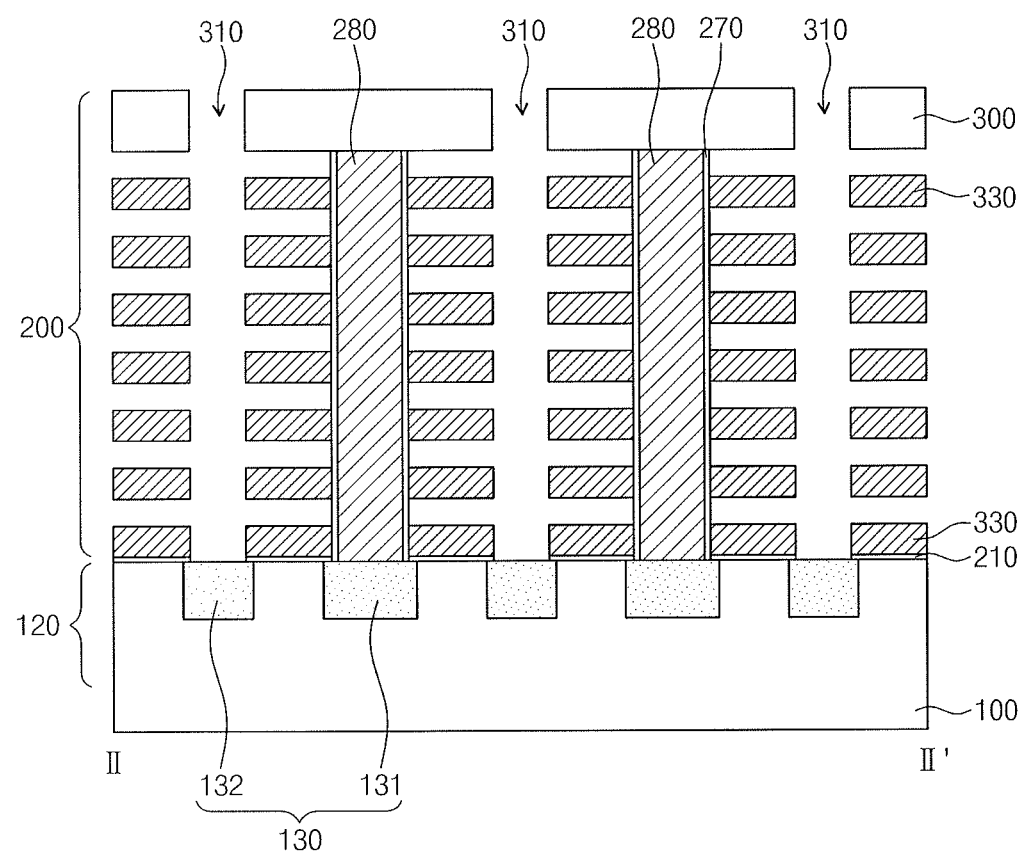

Referring to FIGS. 18, 19A, and 19B, the mold layers 230 exposed by the second trenches 310 may be selectively removed. FIGS. 19A and 19B are sectional views taken along lines I-I' and II-II', respectively, of FIG. 18. As the result of the removal of the mold layers 230, sidewalls of the variable resistance layers 270 may be exposed. In example embodiments, the first gap-filling layers 250 may be removed during the removal of the mold layers 230. For this, the first gap-filling layers 250 may be, e.g., formed of a material that does not have etch selectivity with respect to the mold layers 230. In example embodiments, the first gap-filling layers 250 and the mold layers 230 may be formed of the same material, e.g., a silicon oxide layer. As the result of the removal of the mold layers 230 and the first gap-filling layers 250, portions of outer sidewalls of the variable resistance layers 270 that are not covered with the horizontal electrodes 330 may be exposed.

Figure 20:
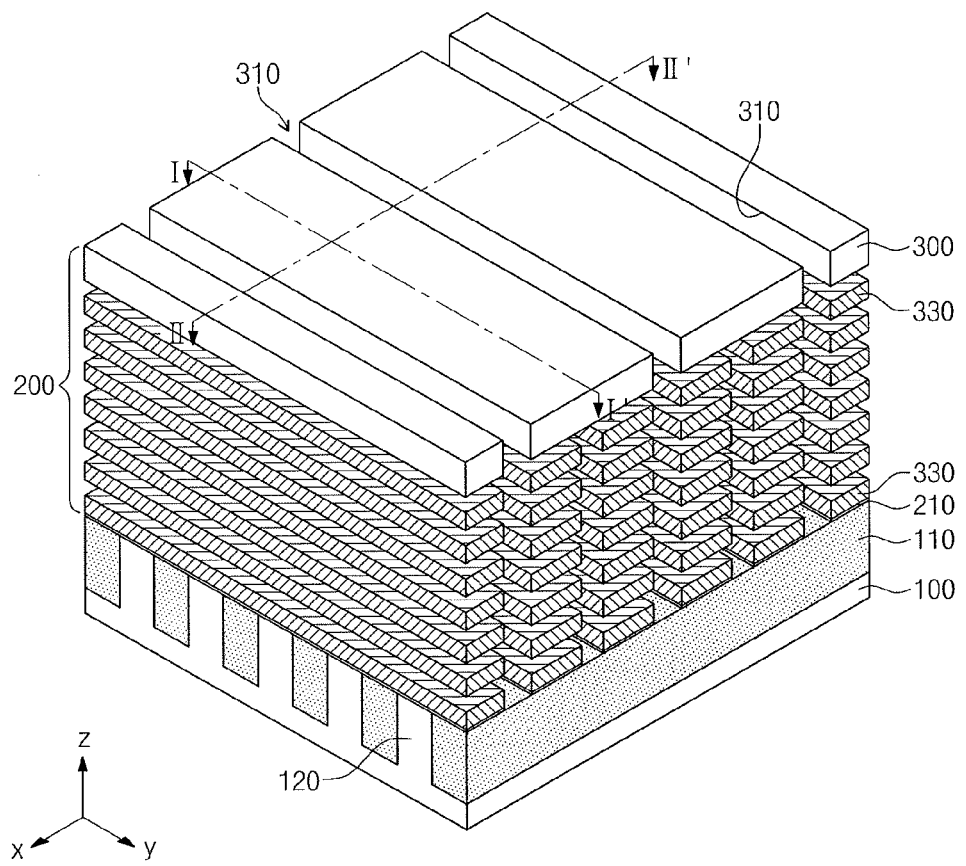
Figure 21A:
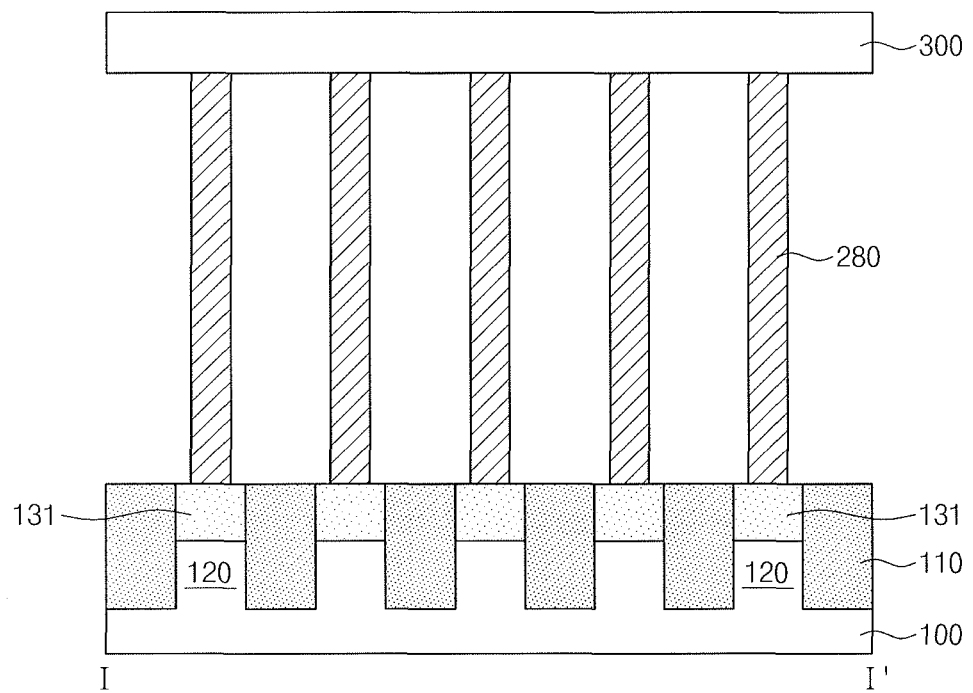
Figure 21B:
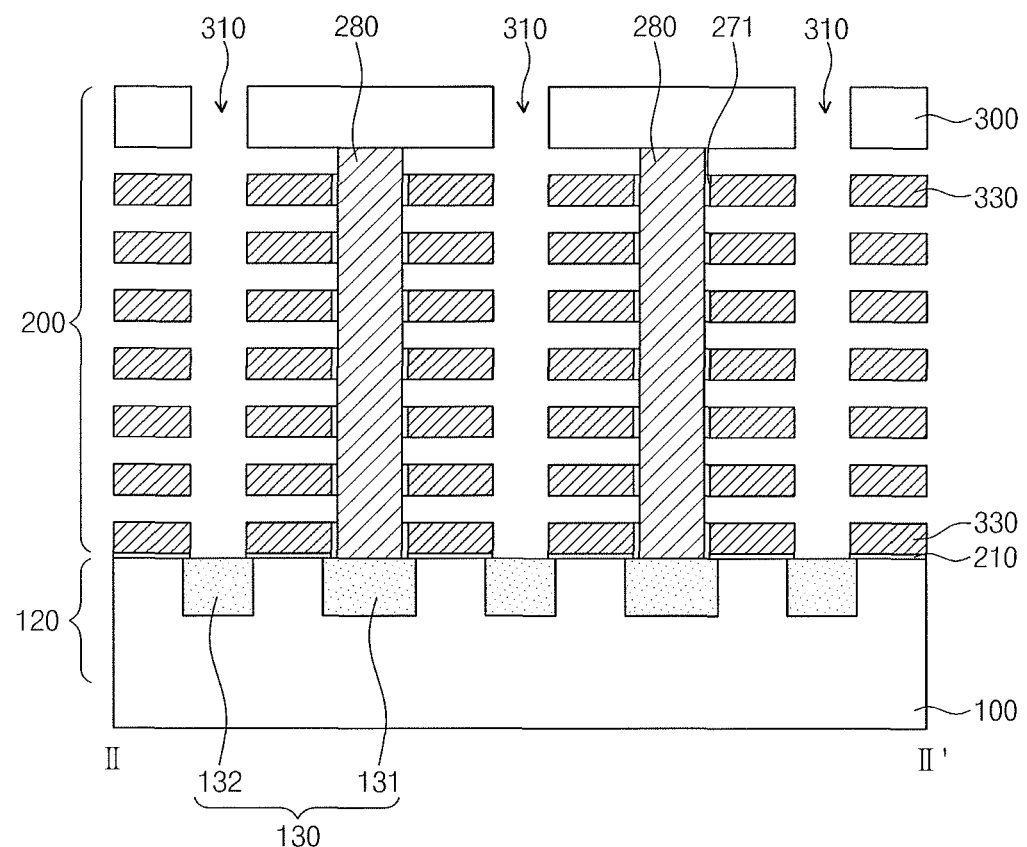

Referring to FIGS. 20, 21A, and 21B, an etching process may be performed to etch the exposed portions of the outer sidewalls of the variable resistance layers 270. FIGS. 21A and 21B are sectional views taken along lines I-I' and II-II', respectively, of FIG. 20. In example embodiments, the etching process may be performed to form variable resistance patterns 271 interposed between the horizontal electrodes 330 and the vertical electrodes 280. The etching process may be a dry and/or wet etching process, which includes a step of supplying an etching material to the variable resistance layers 270 through the second trenches 310. The etching process may be performed until the variable resistance layers 270 are selectively vertically cut to expose portions of the sidewalls of the vertical electrodes 280. The shape of the variable resistance pattern 271 will be described in more detail with reference to FIGS. 28 and 31.

Figure 22:
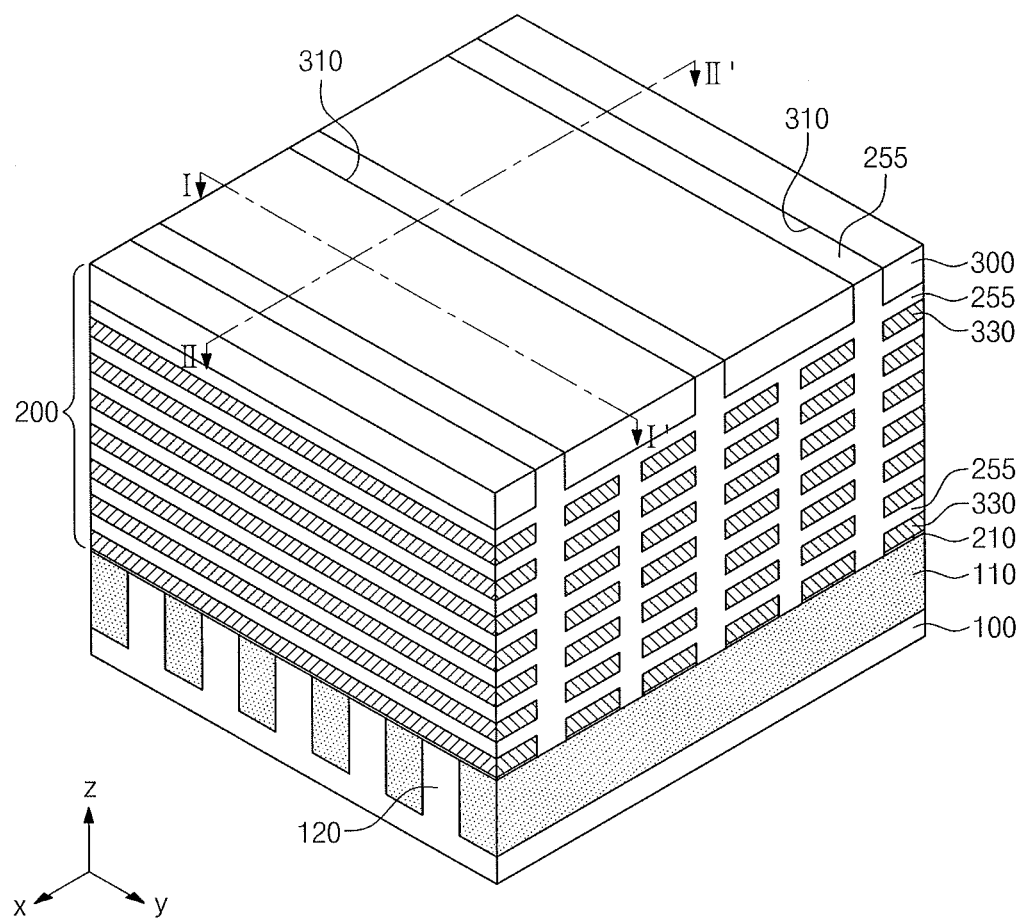
Figure 23A:
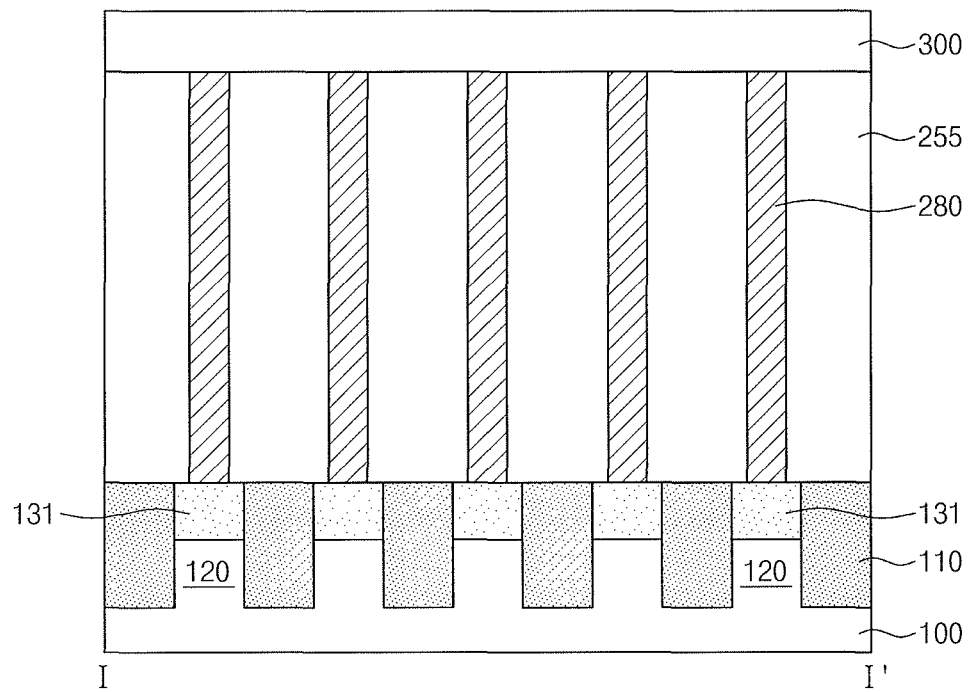
Figure 23B:
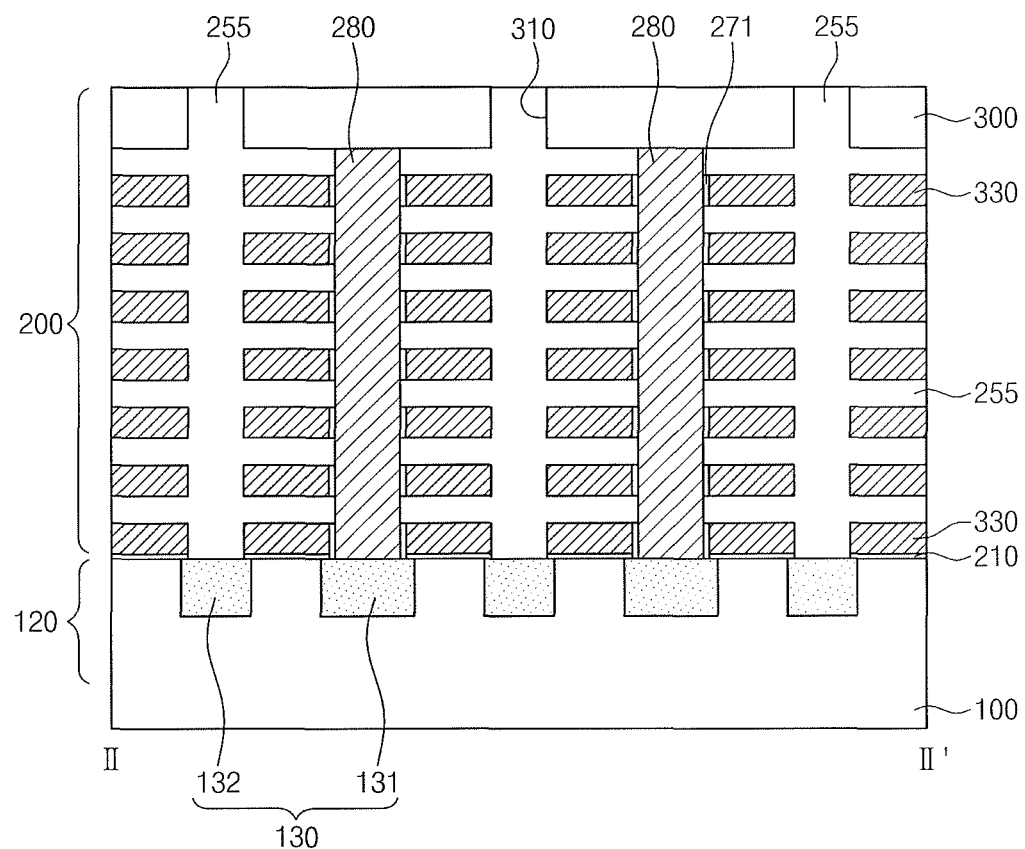

Referring to FIGS. 22, 23A, and 23B, an insulating isolation layer 255 may be formed on the structure provided with the variable resistance patterns 271 to fill the second trenches 310. FIGS. 23A and 23B are sectional views taken along lines I-I' and II-II', respectively, of FIG. 22. The insulating isolation layer 255 may be formed to fill the second trenches 310 and the recesses formed by removal of the mold layers 230. For example, the insulating isolation layer 255 may fill, e.g., completely fill, spaces between the horizontal electrodes 330 and may cover the exposed sidewalls of the vertical electrodes 280. In example embodiments, the insulating isolation layer 255 may include at least one of SOG materials and silicon oxide. A dielectric constant of the insulating isolation layer 255 may be smaller than that of the variable resistance pattern 271.

Figure 24:
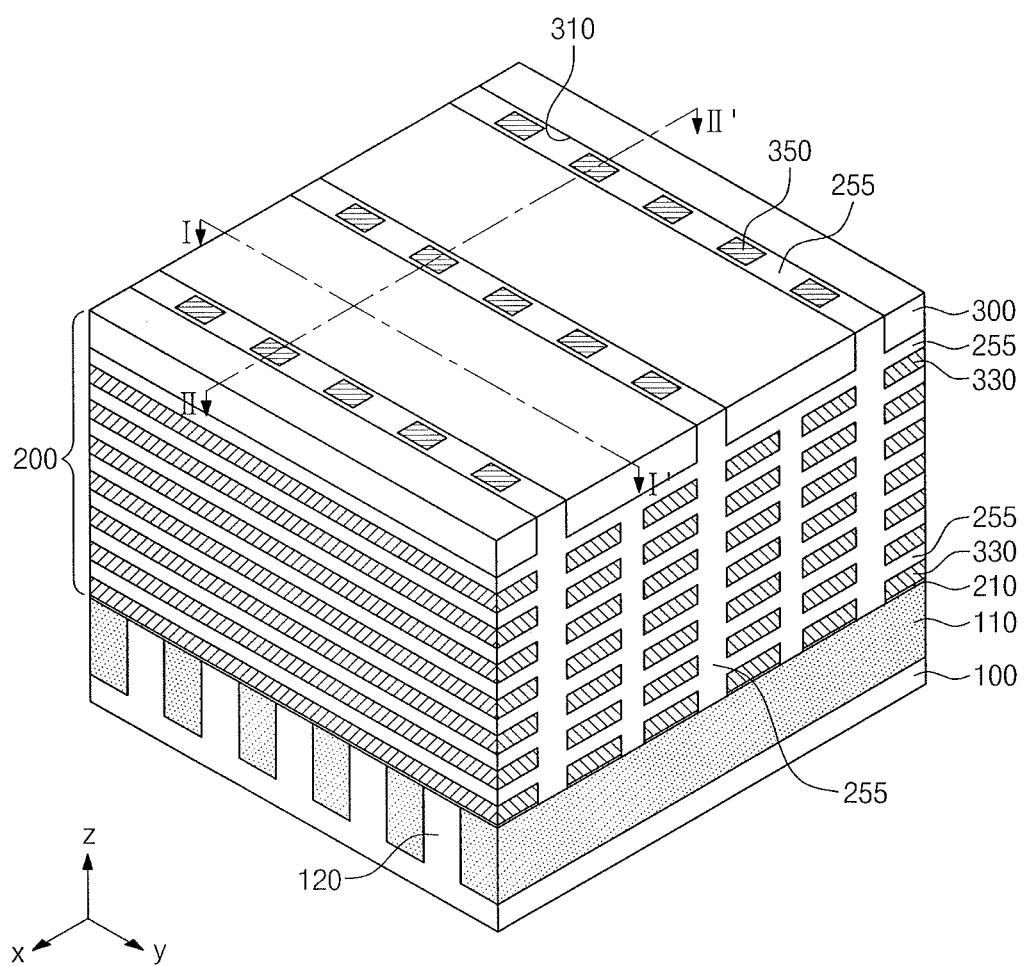
Figure 25A:
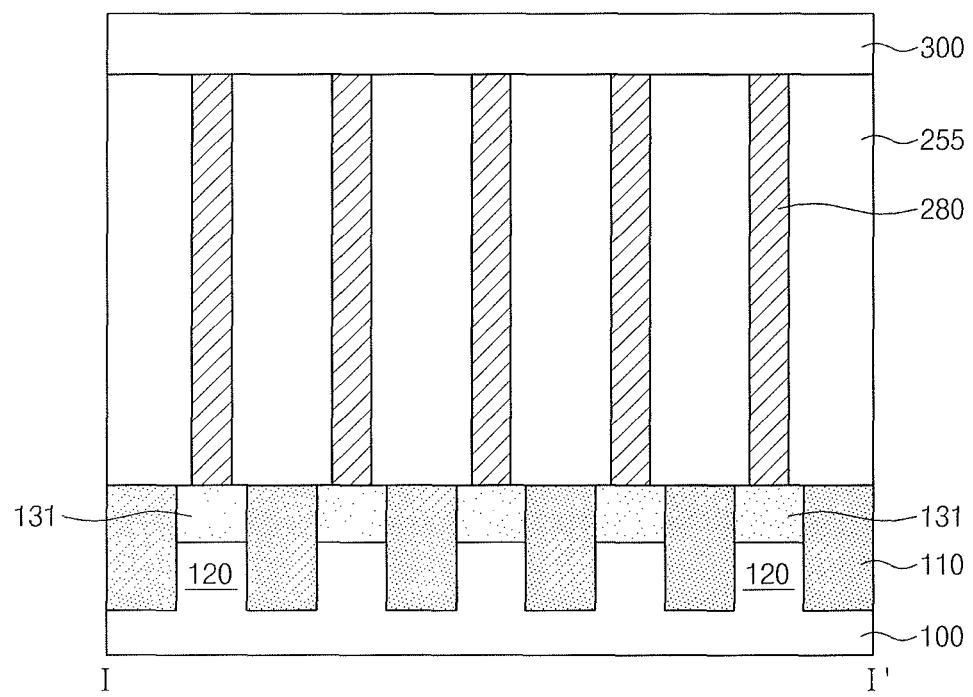
Figure 25B:
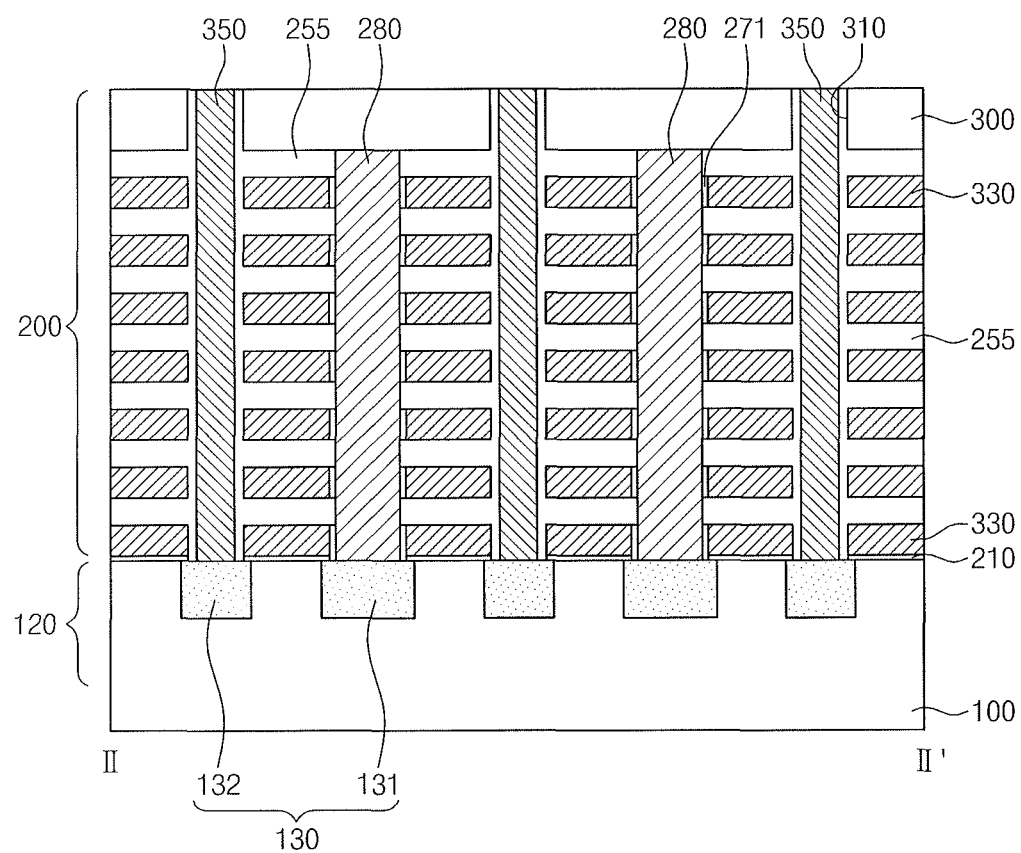

Referring to FIGS. 24, 25A, and 25B, plugs 350 may be formed through the insulating isolation layer 255 to be connected to the second doped regions 132, respectively. FIGS. 25A and 25B are sectional views taken along lines I-I' and II-II', respectively, of FIG. 24. In example embodiments, the plugs 350 may serve as the bit line plug BLP described with reference to FIG. 1. For example, the plugs 350 may be formed spaced apart from the horizontal electrodes 330 by the insulating isolation layer 255 therebetween. In another exemplary implementation, the insulating isolation layer 255 may be formed to partially fill the second trenches 310, and the second plugs 350 may be formed to fill the remaining spaces of the second trenches 310 that are not filled with the insulating isolation layer 255.

The plugs 350 may include at least one of conductive materials, such as doped semiconductors, metals, conductive metal nitrides, and silicides. For example, the plugs 350 may include at least one of TiN, W, WN, Pt, and Au. A horizontal section of the plug 350 may be shaped like a quadrangle as shown in FIG. 24. However, exemplary embodiments are not limited thereto, e.g., the plug 350 may be formed to have a circular or elliptical horizontal section.

Figure 26:
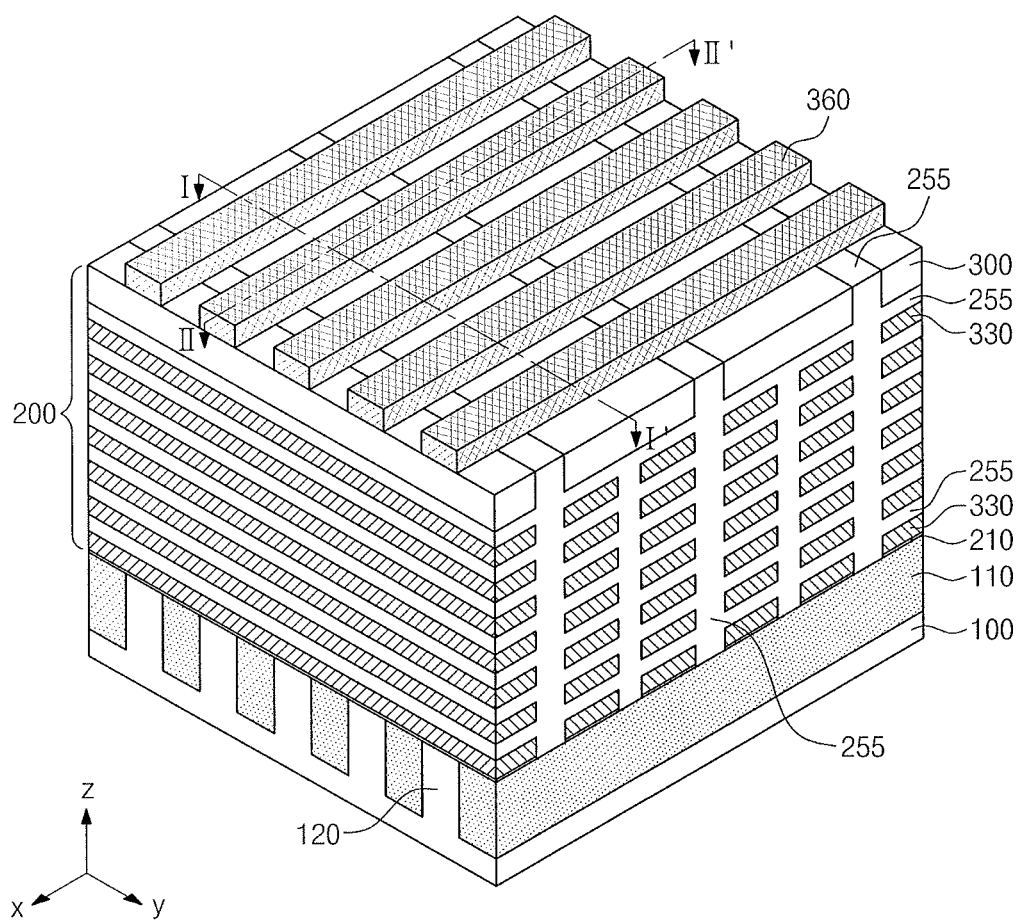
Figure 27A:
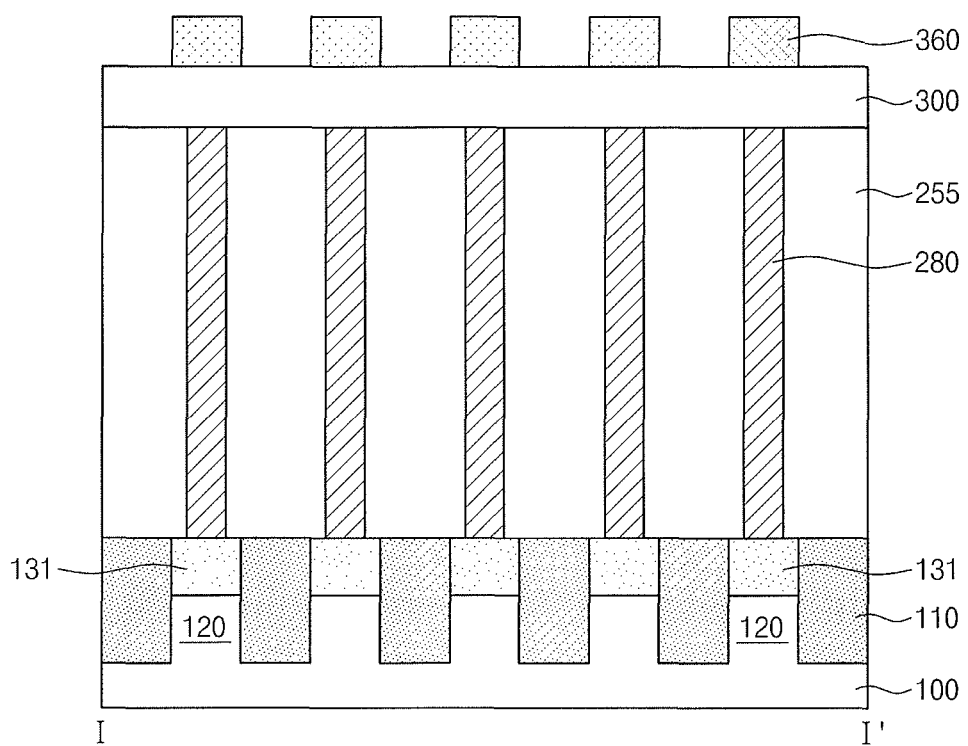
Figure 27B:
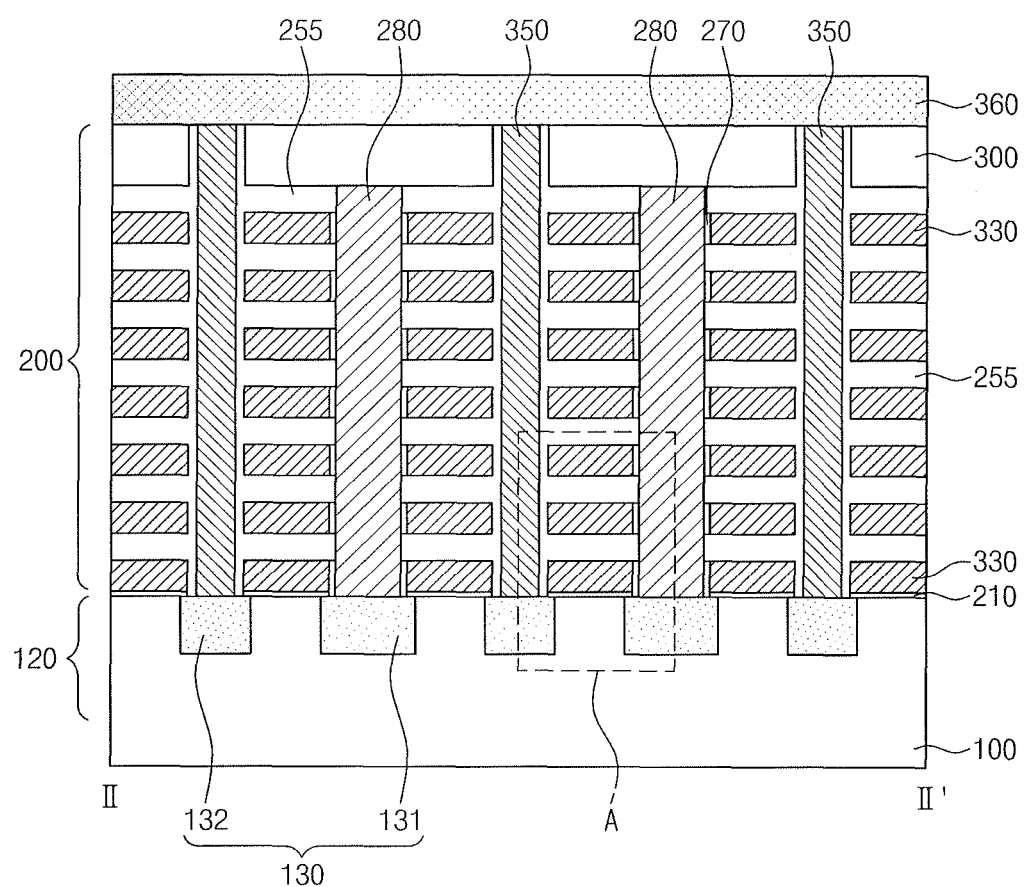
Figure 28:
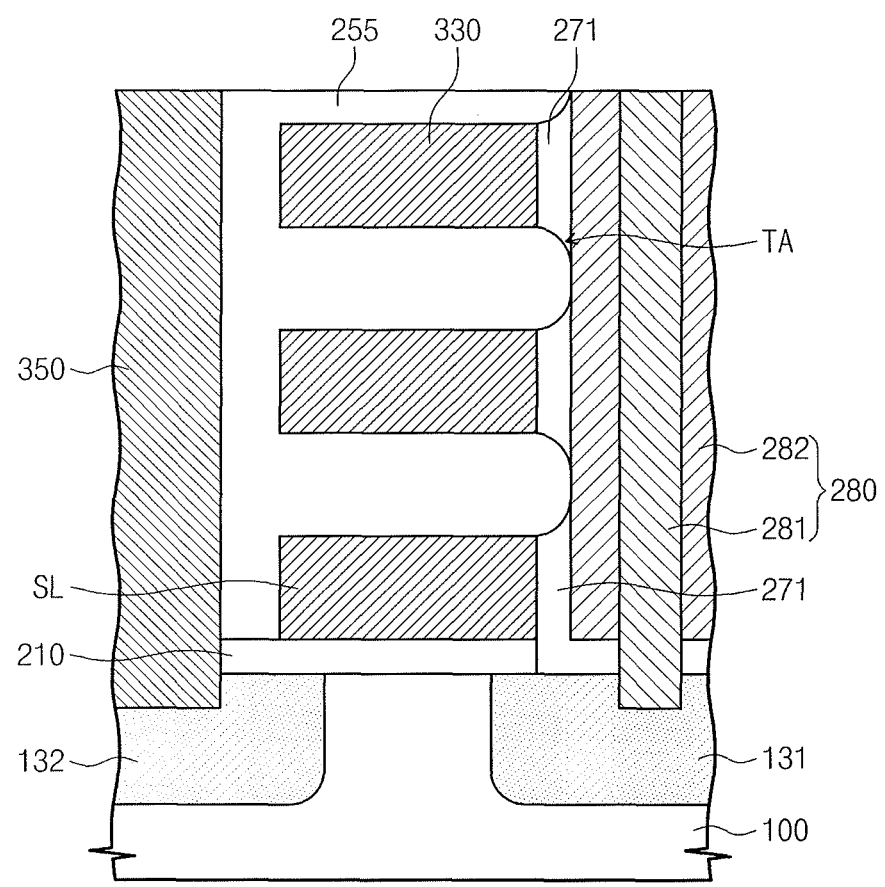
FIGS. 28 through 31 illustrate exemplary enlarged views of a region A of FIG. 27B.

Referring to FIGS. 26, 27A, and 27B, upper interconnection lines 360 may be formed on the plugs 350, e.g., along an x-axis direction. FIGS. 27A and 27B are sectional views taken along lines I-I' and II-II', respectively, of FIG. 26. The upper interconnection lines 360 may be formed to cross the horizontal electrodes 330 in the direction in which the horizontal electrodes 330 are spaced apart by the vertical electrodes 280 and the plugs 350. Each of the upper interconnection lines 360 may connect a plurality of the plugs 350 disposed thereunder. The upper interconnection lines 360 may include at least one of conductive materials, such as doped semiconductors, metals, conductive metal nitrides, and silicides. For example, the upper interconnection lines 360 may include tungsten. In example embodiments, the upper interconnection lines 360 may be used as the bit line BL described with reference to FIG. 1.

FIGS. 28 through 31 are enlarged exemplary views of a region A of FIG. 27B. The lowermost one of the horizontal electrodes 330 may be used as the selection line SL of FIG. 1. The selection line SL may form a selection transistor SST with the gate insulating layer 210, and with the first and second doped regions 131 and 132 provided thereunder. The lowermost one of the variable resistance patterns 271 may be in contact with a sidewall of the selection line SL and extend on a top surface of the first doped region 131.

According to an exemplary implementation, each of the vertical electrodes 280 may include a first vertical electrode 282 provided on the variable resistance pattern 271 and a second vertical electrode 281 connected to the first doped regions 131. The second vertical electrode 281 may extend through the first vertical electrodes 282 and the variable resistance patterns 271. For example, the formation of the vertical electrodes 280 may include forming the first vertical electrodes 282 to partially fill the vertical holes, removing bottom portions of the variable resistance patterns 271 exposed by the vertical electrodes 282, and then, filling the resultant vertical holes with the second vertical electrodes 281.

The variable resistance patterns 271 may be spaced apart from each other along the vertical direction (e.g., normal to the top surface of the substrate 100) by the insulating isolation layer 255. For example, the variable resistance patterns 271 may be separated into discrete portions along a direction normal to the top surface of the substrate 100. The discrete portions of the variable resistance patterns 271 may have portions of the insulating isolation layer 225 disposed directly therebetween, which insulating isolation layer 225 may be a continuous layer that covers the discrete portions of the variable resistance patterns 271. The insulating isolation layer 225 may be coupled with, e.g., directly coupled with, edges of the variable resistance patterns 271 while being in a non-contacting relationship with a center region of the variable resistance patterns 271. For example, the insulating isolation layer 225 may abut edges of each of the discrete variable resistance patterns 271. The insulating isolation layer 255 may be in contact with the vertical electrodes 280, e.g., may be directly coupled with the first vertical electrode 282.

A shape of the variable resistance pattern 271 may be variously modified depending on the etching process described with reference to, e.g., FIGS. 20, 21A, and 21B. As exemplarily shown in FIG. 28, in a vertical section, each of the variable resistance patterns 271 may include tails TA extending between the horizontal electrodes 330. For example, the insulting isolation layer 255 may have rounded sides corresponding to the tails TA on the edges of the variable resistance patterns 271.

Figure 29:
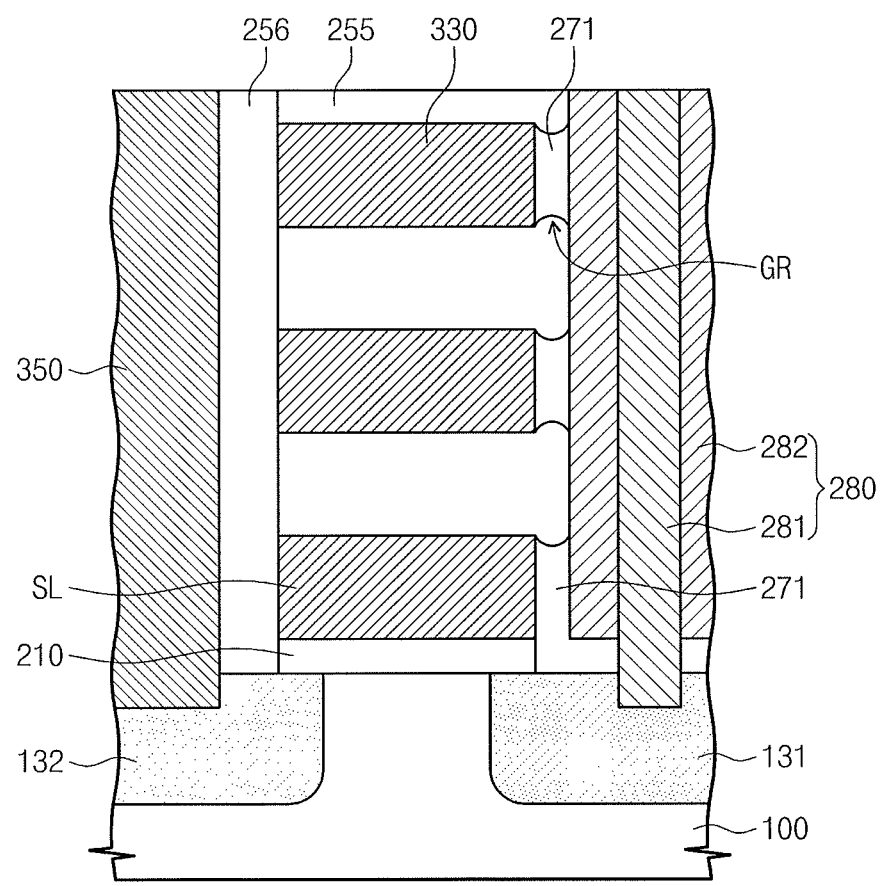

In other example embodiments, as exemplarily shown in FIG. 29, each of the variable resistance patterns 271 may include grooves GR that are formed on top and bottom surfaces, e.g., top and bottom edges, thereof. Further, the insulating isolation layer 255 may have protrusions corresponding to the grooves GR on the edges of the variable resistance patterns 271.

As exemplarily shown in FIG. 29, the insulating isolation layer 255 and the horizontal electrodes 330 may be horizontally spaced apart from the plugs 350 by first insulating layer 256. For example, a portion of the insulating isolation layer 255 may be removed from the second trenches 310 before the formation of the vertical electrodes 280 described with reference to FIG. 24, and the formation of the first insulating layer 256 may be performed after the partial removal of the insulating isolation layer 255. In the case where the first insulating layer 256 covers the second doped regions 132, a bottom surface of the first insulating layer 256 may be additionally removed to expose the second doped regions 132. The first insulating layer 256 may be a silicon oxide layer or a silicon oxynitride layer.

Figure 30:
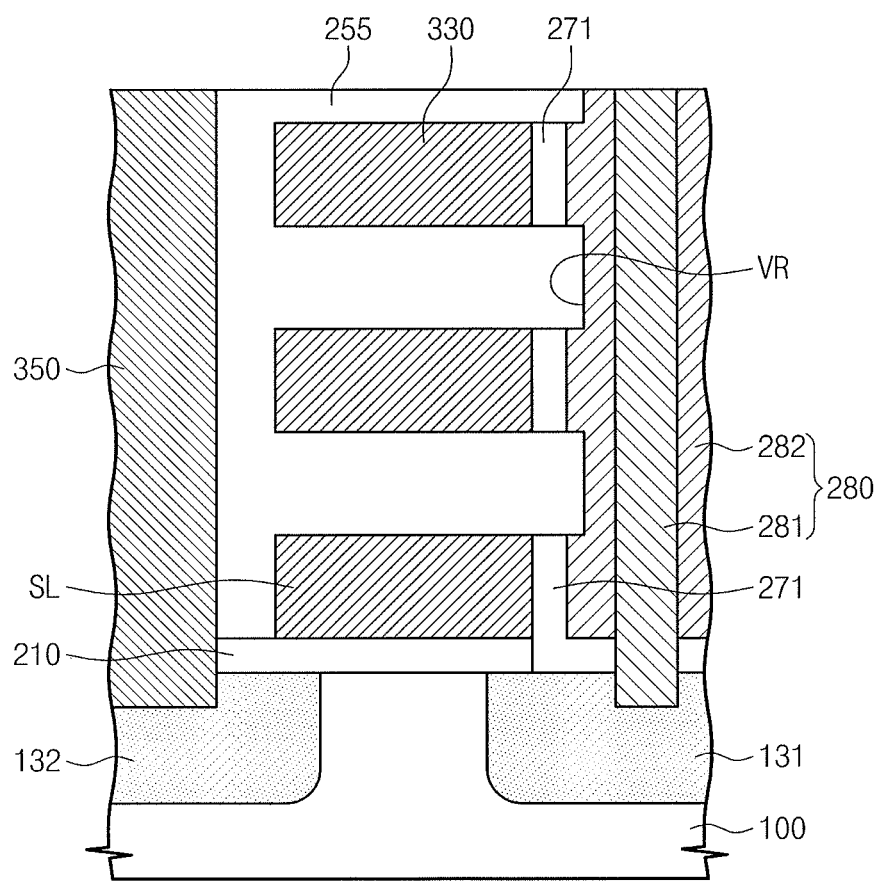

In another exemplary implementation, the vertical electrodes 280 may have a sidewall provided with recessed regions VR as shown in FIG. 30, and the insulating isolation layer 255 may be formed to fill the recessed regions VR.

Figure 31:
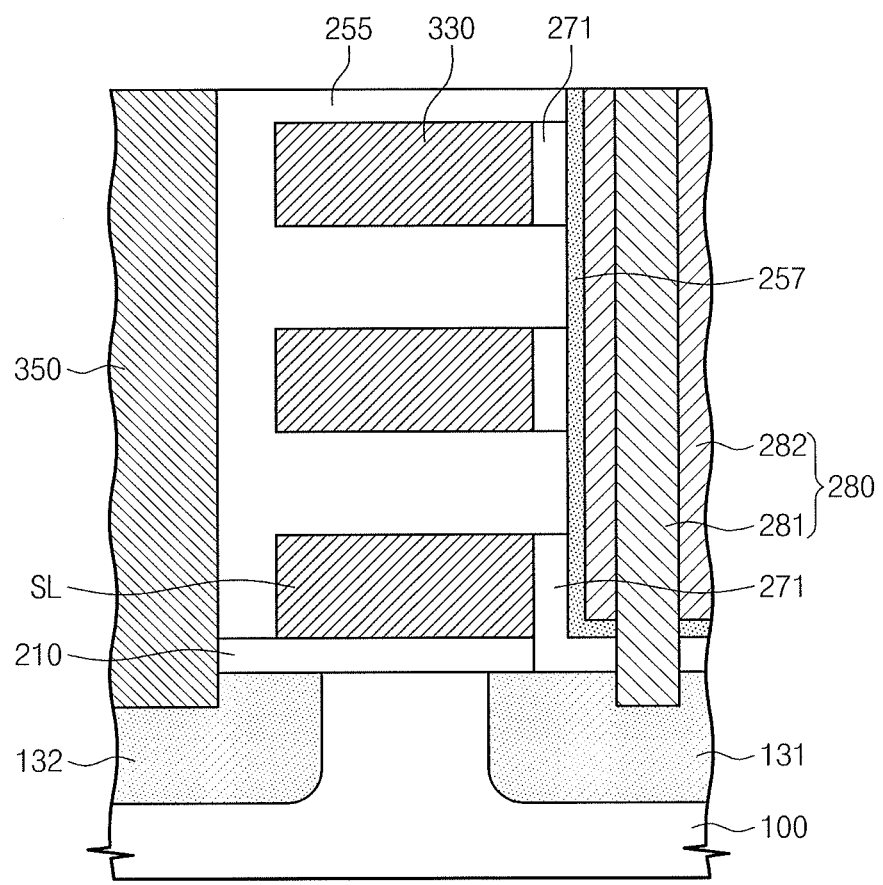

In yet another exemplary embodiment, as shown in FIG. 31, a protection insulating layer 257 may be provided between the variable resistance patterns 271 and the vertical electrodes 280. The protection insulating layer 257 may be in contact with the insulating isolation layer 255. In example embodiments, the protection insulating layer 257 may be formed of a material having an etching selectivity with respect to the variable resistance patterns 271.

The variable resistance patterns 271 and insulating layers adjacent thereto have been described in terms of disposition, shape and/or technical feature, but exemplary embodiments are not limited thereto.

Figure 32:
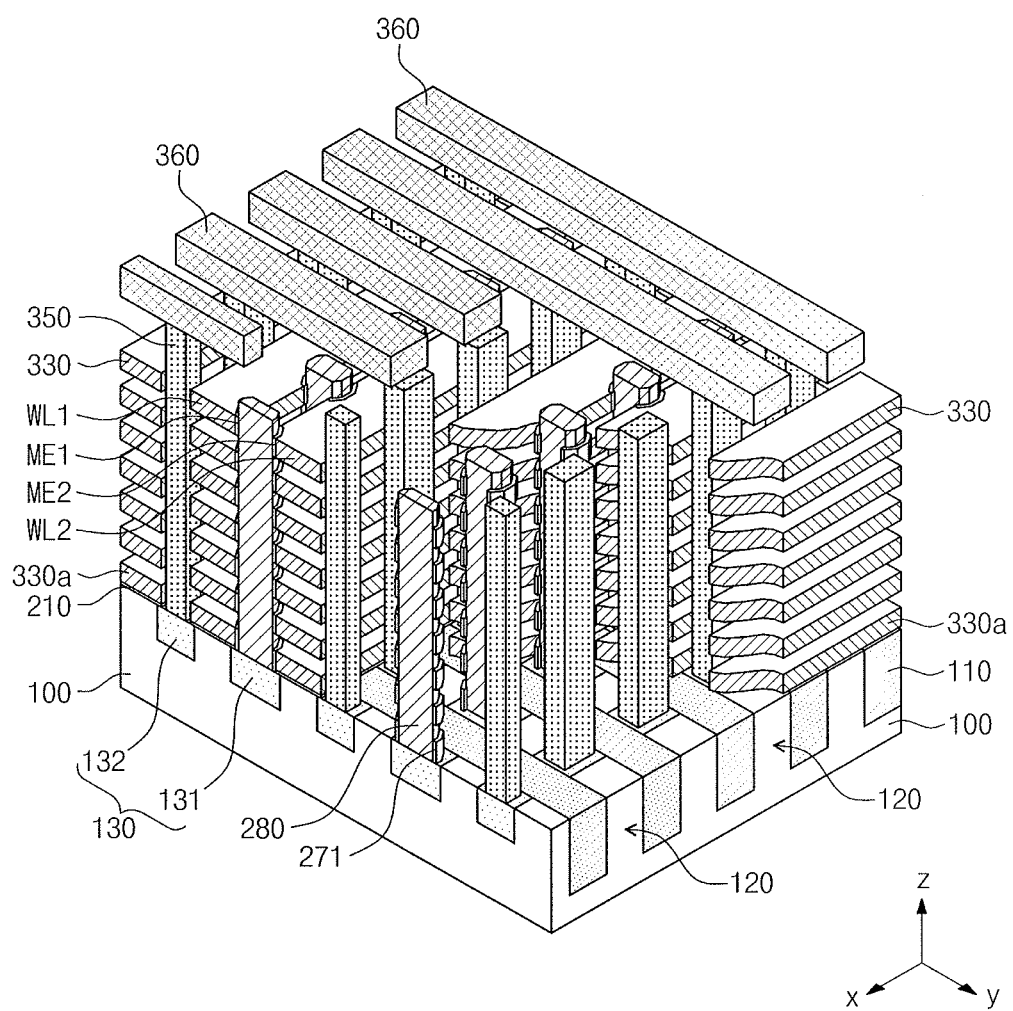
FIG. 32 illustrates a perspective view schematically showing a cell array region of a variable resistance memory device according to exemplary embodiments.
Figure 33:
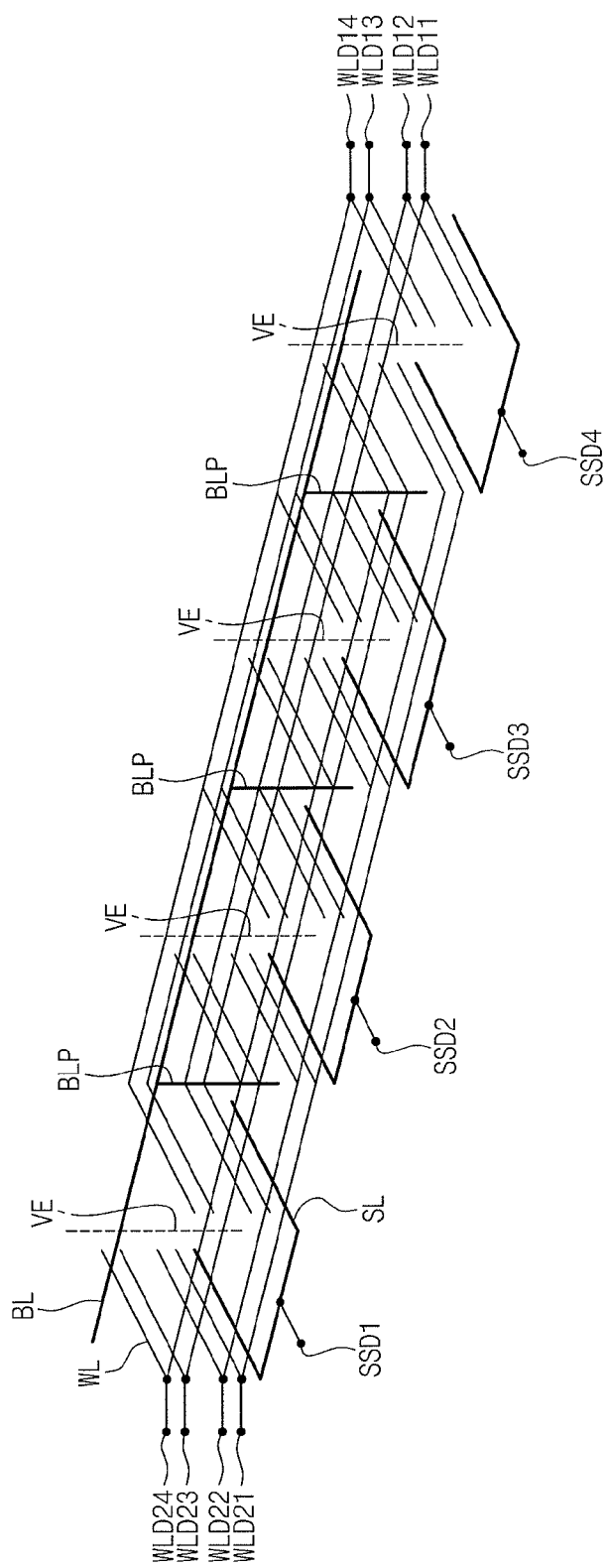
FIG. 33 illustrates a diagram schematically showing an interconnection structure of a cell array region of a variable resistance memory device according to exemplary embodiments.

FIG. 32 illustrates a perspective view schematically showing a cell array region of a variable resistance memory device according to exemplary embodiments. FIG. 33 is a diagram schematically illustrating an interconnection structure of a cell array region of a variable resistance memory device according to exemplary embodiments.

Referring to FIGS. 1 and 32, a plurality of upper interconnection lines 360 may be provided on a substrate 100 to serve as the bit lines BL of FIG. 1. The substrate 100 may include a plurality of active regions 120 parallel to the upper interconnection lines 360. The active regions 120 may be delimited by a plurality of device isolation layers 110 provided in the substrate 100.

In each active region 120, there may be a plurality of doped regions 130 arranged in a row along a direction parallel to the upper interconnection line 360. The doped regions 130 may be spaced apart from each other to define channel regions. The doped regions 130 may include a plurality of first doped regions 131 and a plurality of second doped regions 132, which may be alternatingly arranged with respect to each other.

The vertical electrodes 280 may be connected to the first doped regions 131, respectively, and the plugs 350 may be connected to the second doped regions 132, respectively. The plugs 350 may serve as the bit line plugs BLP of FIG. 1. The vertical electrodes 280 and the plugs 350 may be alternatingly arranged on the substrate 100, e.g., along the y-axis direction.

A plurality of horizontal electrodes 330 (e.g., VE) may be provided on the channel regions so as to cross, e.g., overlap, the device isolation layers 110. The horizontal electrodes 330 may serve as the word lines WL and/or the selection lines SL of FIG. 1. In example embodiments, a lowermost one 330a of the horizontal electrodes 330 may serve as the selection lines SL and the others may serve as the word lines WL.

The variable resistance patterns 271, e.g., ME1 and ME2, may be provided between the horizontal electrodes 330 and the vertical electrodes 280. The variable resistance patterns 271 may serve as the memory element of the memory device. The variable resistance patterns 271 may be spaced apart from each other along the vertical direction (e.g., normal to the top surface of the substrate 100). In example embodiments, the horizontal electrodes 330 may include the first word lines WL1 and the second word lines WL2 that are spaced apart from each other with the vertical electrode 280 interposed therebetween and are located at the same level from the top surface of the substrate 100.

The first variable resistance patterns ME1 between the first word lines WL1 and the vertical electrodes 280 may be horizontally separated from the second variable resistance patterns ME2 between the second word lines WL2 and the vertical electrodes 280. The first and second variable resistance patterns ME1 and ME2 may be used as distinct and independent data storages. Accordingly, it may be possible to reduce data disturbance from occurring between adjacent memory cells. For example, the first and second variable resistance patterns ME1 and ME2 may be spaced apart from each other and may be in contact with portions spaced apart from each other of the vertical electrode 280 interposed therebetween. Since the variable resistance patterns are vertically and horizontally separated apart from each other as described above, it may be possible to improve a breakdown voltage of the variable resistance memory device.

FIG. 33 illustrates a diagram schematically illustrating an interconnection structure of a cell array region of a variable resistance memory device according to exemplary embodiments. In example embodiments, a pair of the word lines WL mostly adjacent to each other with the vertical electrodes VE interposed therebetween may be connected to different word line drivers from each other. For example, odd-numbered ones of the word lines may be connected to one of first word line drivers WLD21-WLD 24, and even-numbered ones of the word lines may be connected to one of second word line drivers WLD11-WLD14. Each of the pairs of the selection lines SL mostly adjacent to each other with the vertical electrodes VE interposed therebetween may be connected to the corresponding one of selection line drivers SSD1-SSD4. The selection line drivers SSD1-SSD4 may be configured in such a way that they may be operated in an independent manner.

FIGS. 34 through 37B illustrate perspective views and sectional views illustrating a method of fabricating a variable resistance memory device according to other exemplary embodiments. For the sake of brevity, the elements and features of this example that are similar to those previously shown and described will not be described in much further detail.

Figure 34:
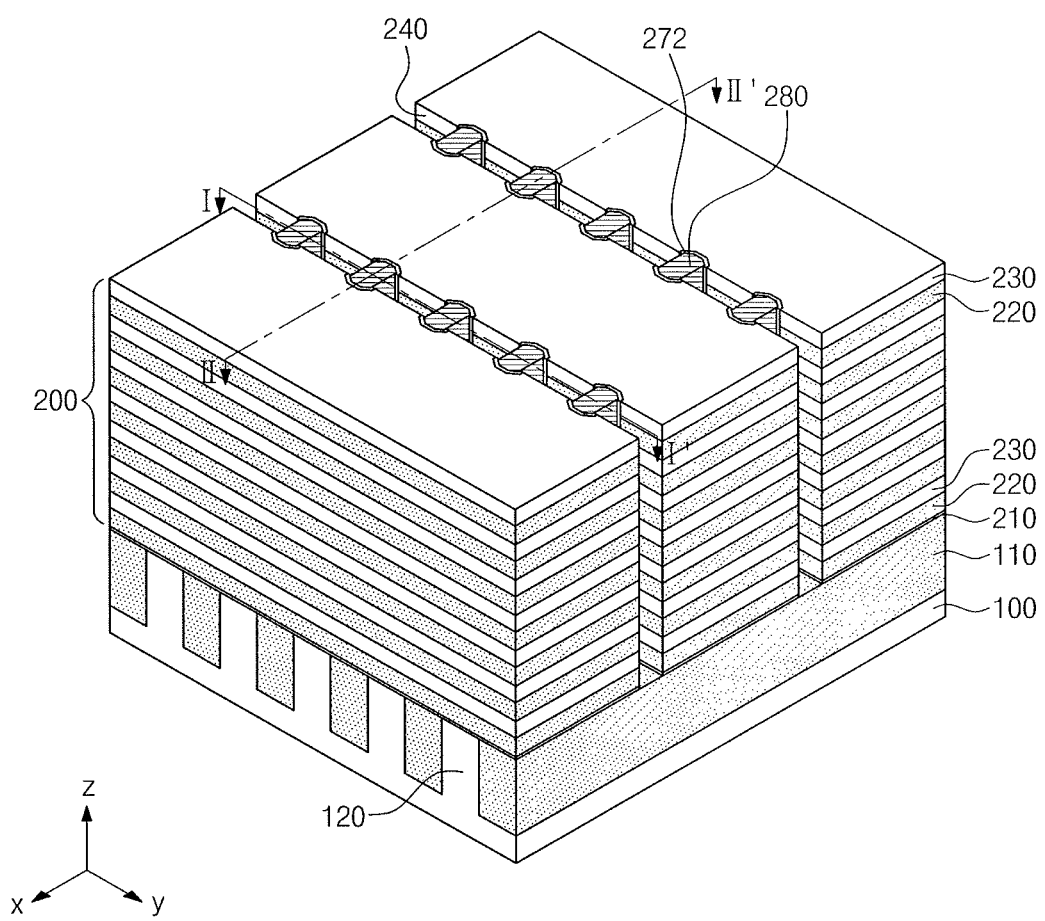
FIGS. 34, 35A, 35B, 36, 37A, and 37B illustrate perspective views and sectional views depicting stages in methods of fabricating variable resistance memory devices according to exemplary embodiments.
Figure 35A:
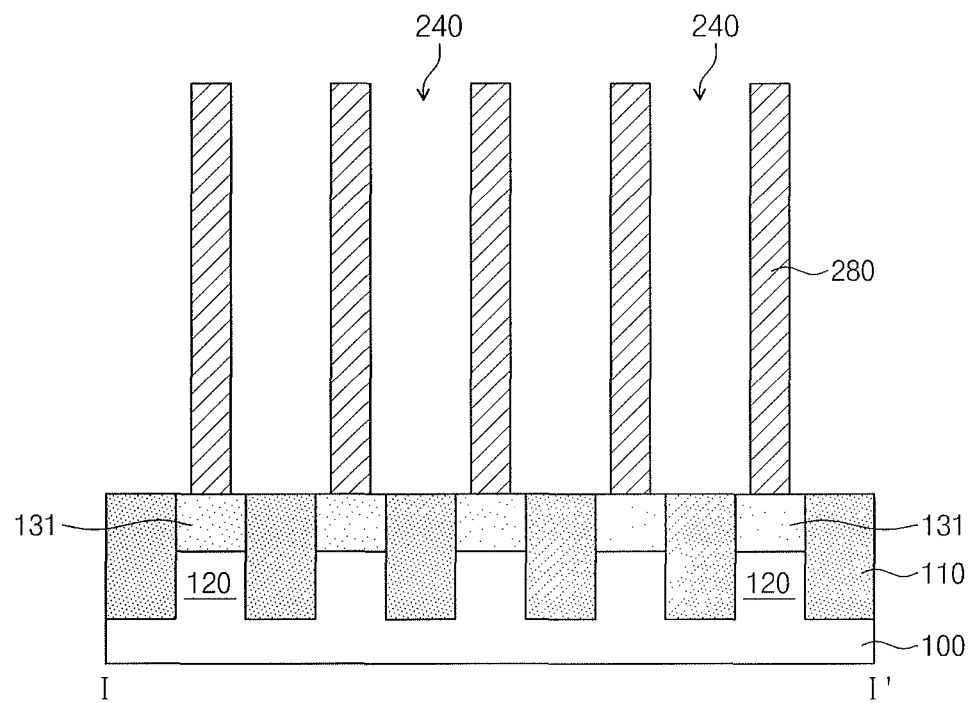
Figure 35B:
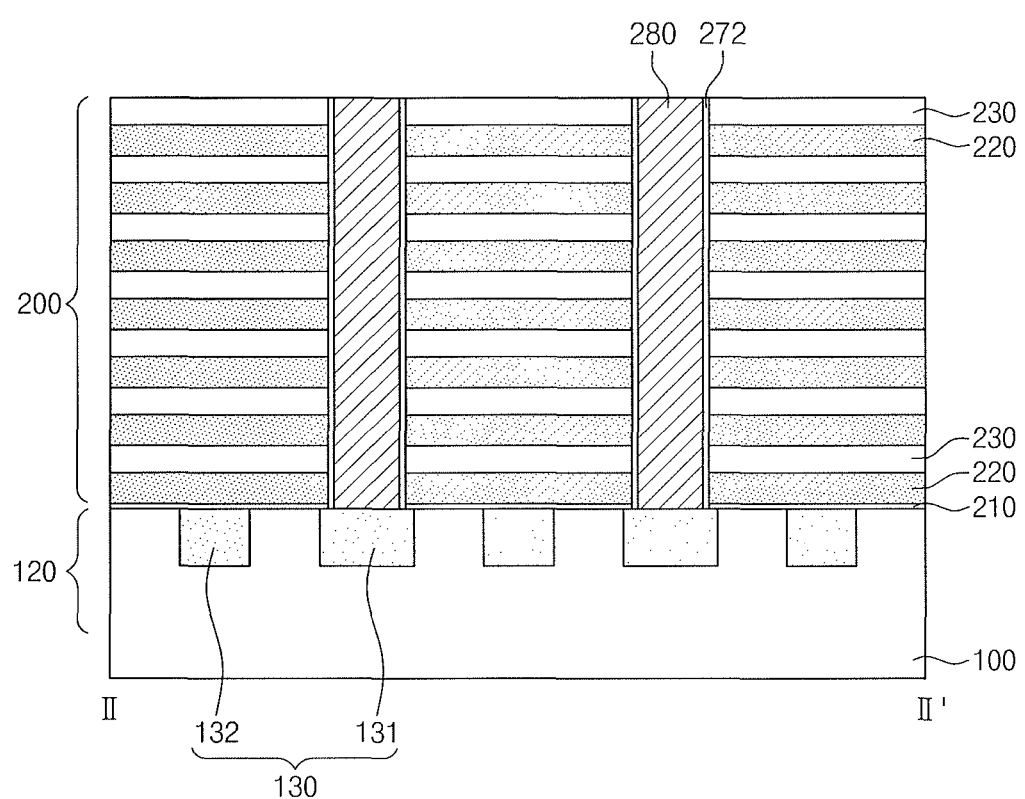

Referring to FIGS. 34, 35A, and 35B, the first gap-filling layers 250 may be removed from the structure described with reference to FIGS. 10 and 11. FIGS. 35A and 35B are sectional views taken along lines I-I' and II-II', respectively, of FIG. 34. As the result of the selective removal of the first gap-filling layers 250, sidewalls of the variable resistance layers 270 may be exposed through the first trenches 240. Thereafter, the exposed sidewalls of the variable resistance layers 270 may be etched to expose sidewalls of the vertical electrodes 280. Accordingly, the variable resistance layers 270 may be horizontally separated from each other by the first trenches 240 to form preliminary variable resistance patterns 272.

Figure 36:
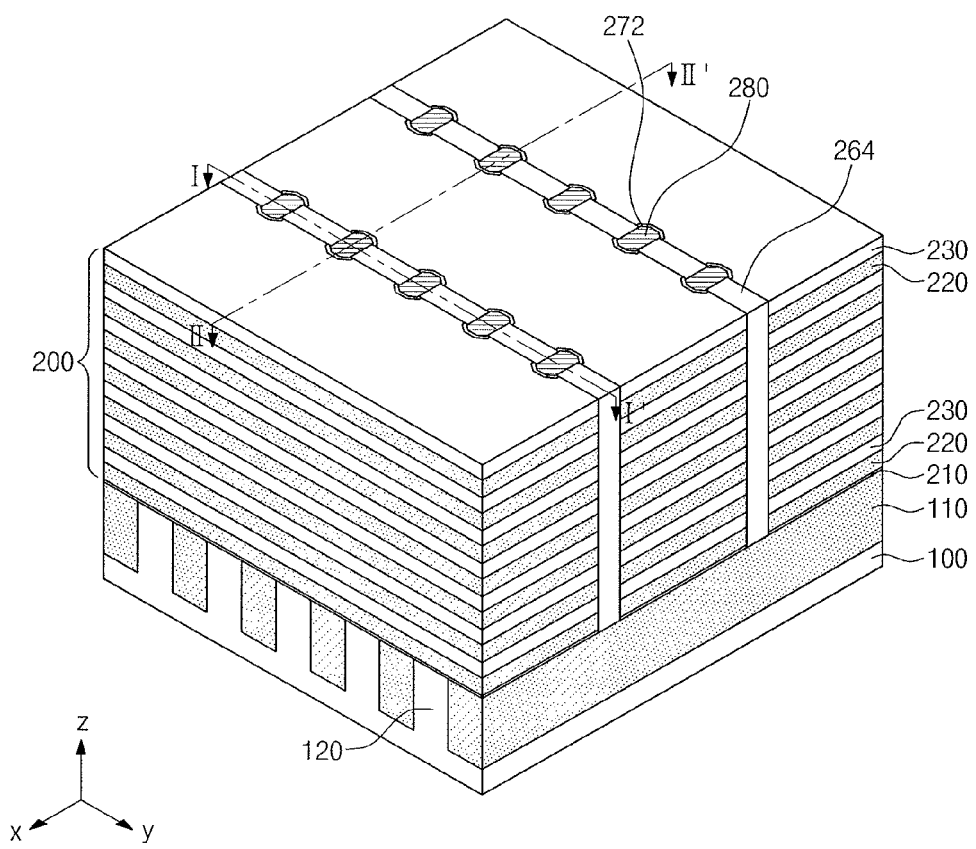
Figure 37A:
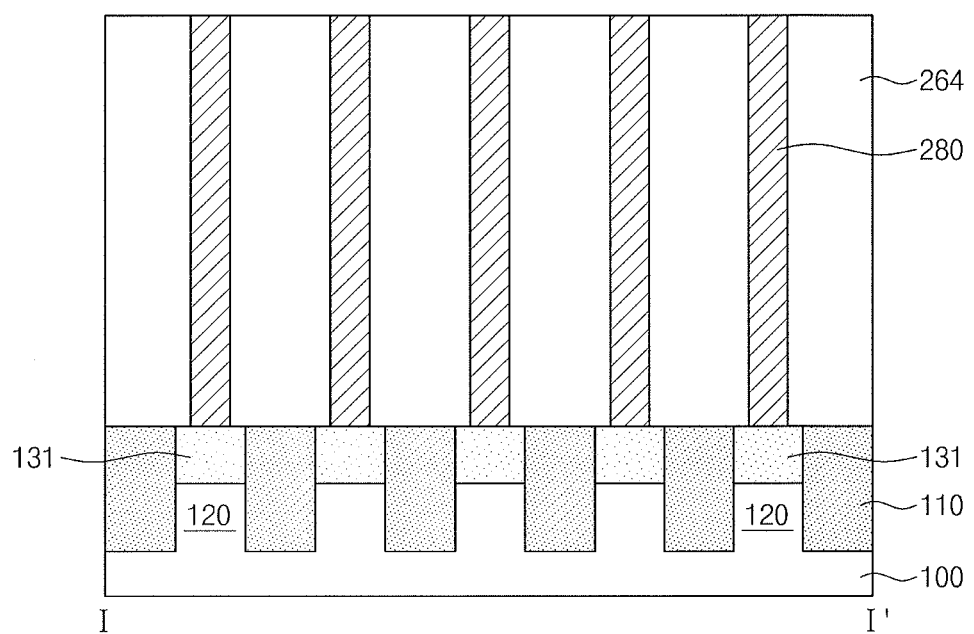
Figure 37B:
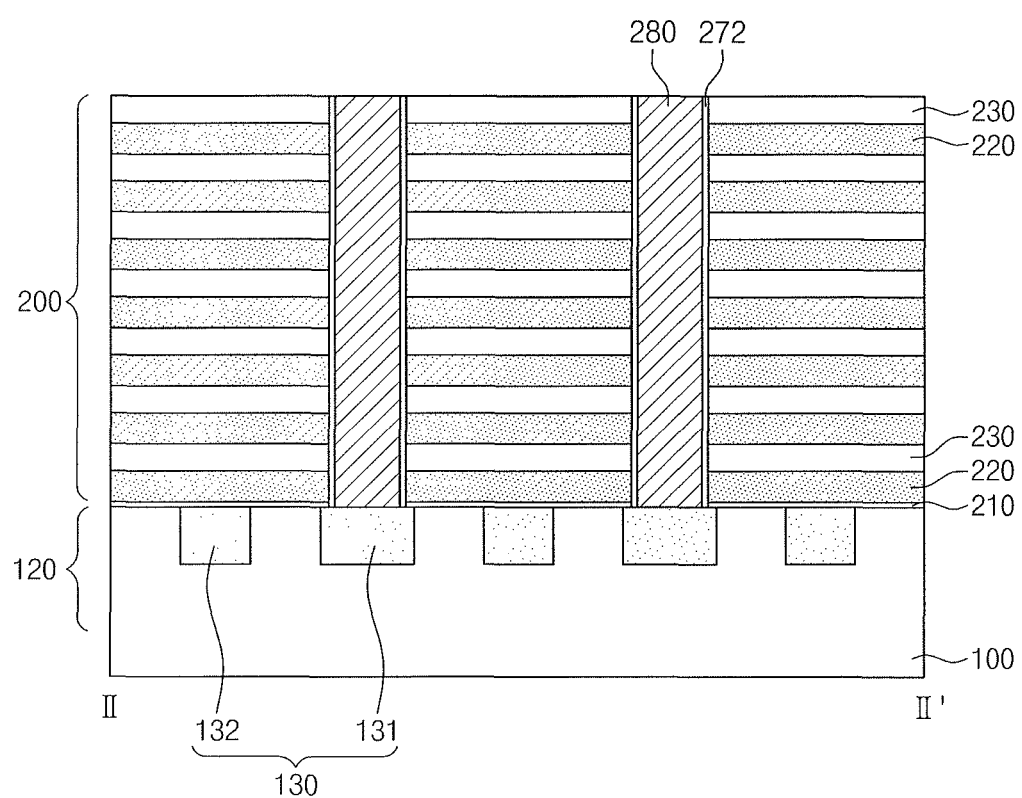

Referring to FIGS. 36, 37A, and 37B, second gap-filling layers 264 may be formed on the resultant structure provided with the preliminary variable resistance patterns 272 to fill the first trenches 240. In example embodiments, the second gap-filling layers 264 may be formed of a material having an etching selectivity with respect to the mold layers 230 and the sacrificial layers 220. Thereafter, the process described with reference to FIGS. 12 through 27 may be performed to the structure provided with the second gap-filling layers 264.

In an exemplary implementation, the second gap-filling layers 264 may not be removed in the removal process of the mold layers 230, described with reference to FIGS. 18 and 19. The preliminary variable resistance patterns 272 may be patterned by the process described with reference to FIGS. 20 and 21 to form the variable resistance patterns 271 spaced apart from each other along a direction normal to the top surface of the substrate 100. Thus, the variable resistance pattern may have the substantially same final structure as that of the variable resistance pattern 271 shown in FIG. 32.

Figure 38:
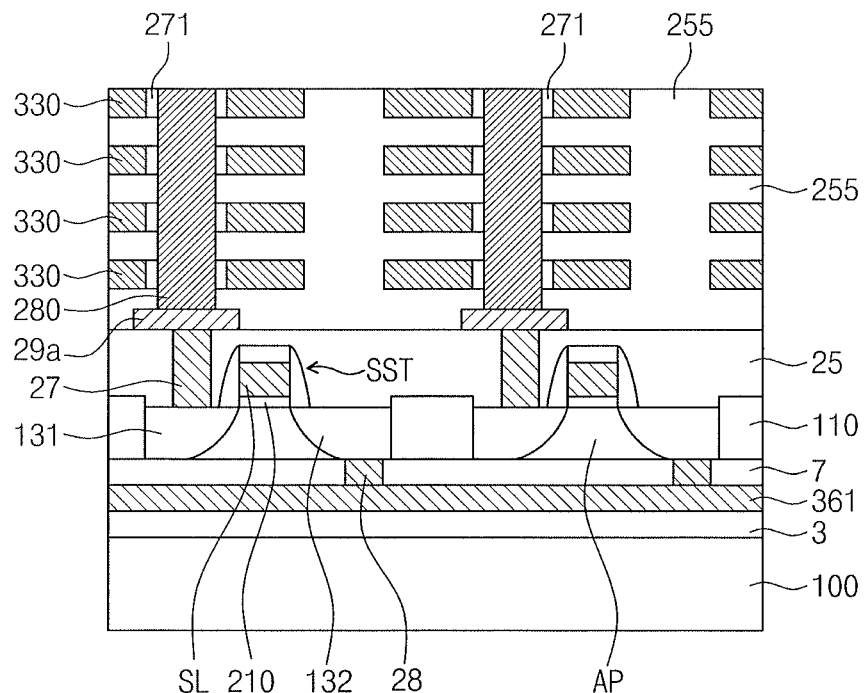
FIGS. 38 through 40 illustrate sectional views of variable resistance memory devices according to exemplary embodiments.
Figure 39:
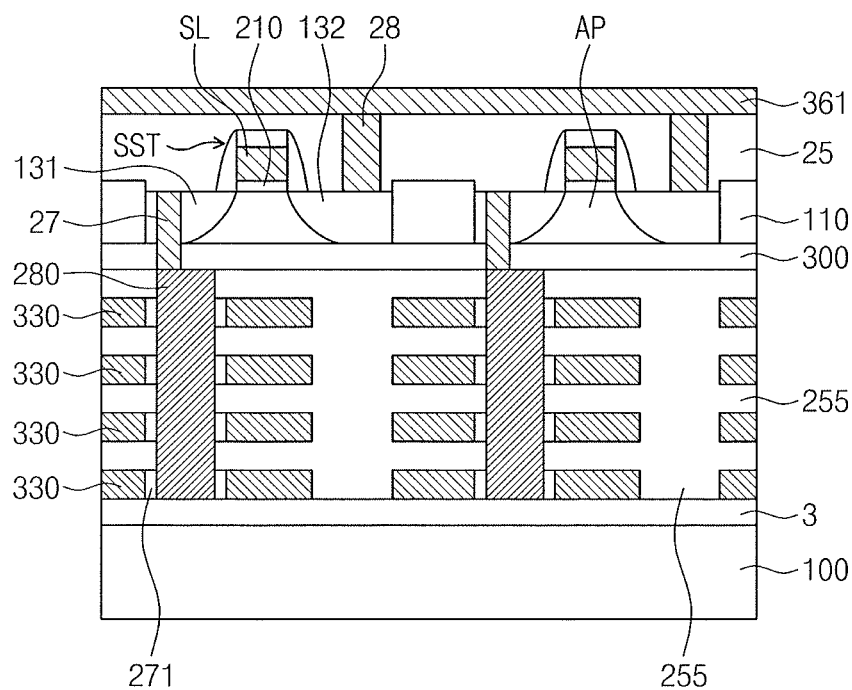
Figure 40:
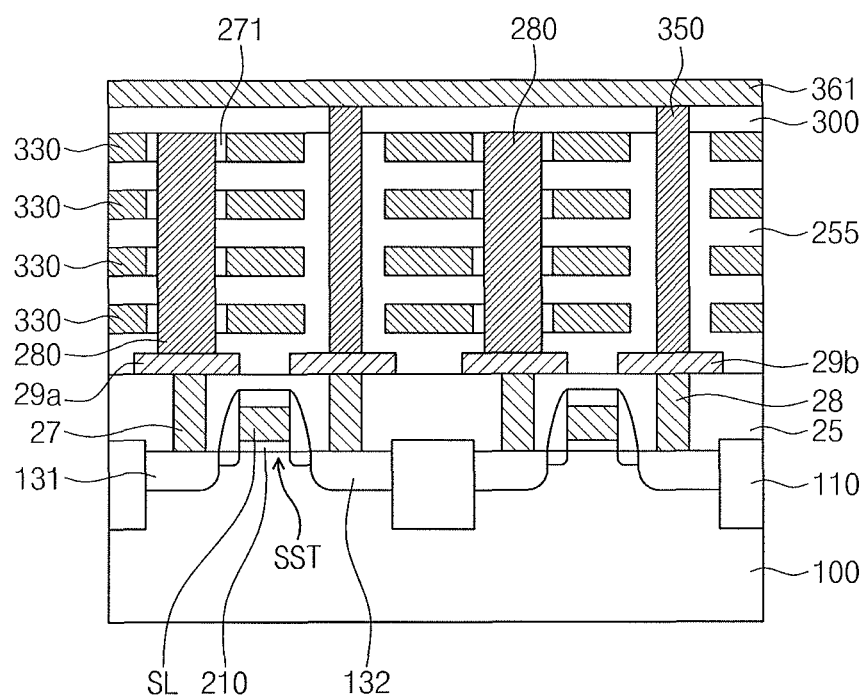

FIGS. 38 through 40 illustrate sectional views of variable resistance memory devices according to other exemplary embodiments. For the sake of brevity, the elements and features of this example that are similar to those previously shown and described will not be described in much further detail. In the present embodiments, the selection lines SL may be formed by a different process from that for forming the word lines WL.

Referring to FIG. 38, active regions AP defined by the device isolation layers 110 may be provided between the horizontal electrodes 330 and the substrate. The active regions AP may be electrically separated from the substrate 100 by a first interlayered insulating layer 3. The selection transistors SST may be provided on the active regions AP. Each of the selection transistors ST may include the selection line SL, which may serve as a gate electrode, the gate insulating layer 210, and the first and second doped regions 131 and 132.

Wires 361 may be provided between the selection lines SL and the substrate 100. In example embodiments, the wires 361 may serve as the bit lines BL of FIG. 1. The wires 361 may be electrically separated from the substrate 100 by the first interlayered insulating layer 3 and from the active regions AP by a second interlayered insulating layer 7. The first doped regions 131 may be electrically connected to the vertical electrodes 280 by first contact plugs 27 penetrating a third interlayered insulating layer 25 and first conductive pads 29a provided thereon. The second doped regions 132 may be electrically connected to the wires 361 by second contact plugs 28 penetrating the second interlayered insulating layer 7.

As shown in FIG. 39, according to another exemplary embodiment, the selection lines SL may be formed on the horizontal electrodes 330. The first contact plugs 27 may connect the first doped regions 131 electrically with the vertical electrodes 280, and the second contact plugs 28 may connect the wires 361 provided on the selection lines SL electrically with the second doped regions 132.

As shown in FIG. 40, according to another exemplary embodiment, the wires 361 may be formed on the horizontal electrodes 330, and the selection lines SL may be formed between the substrate 100 and the horizontal electrodes 330. The second doped regions 132 in the substrate 100 may be electrically connected to the wires 361 through the second contact plugs 28 penetrating the third interlayered insulating layer 25, second conductive pads 29b provided on the second contact plugs 28, and the second plugs 350 penetrating the insulating isolation layer 255. The first doped regions 131 in the substrate 100 may be electrically connected to the vertical electrodes 280 through the first contact plugs 27 and the first conductive pads 29a.

Figure 41:
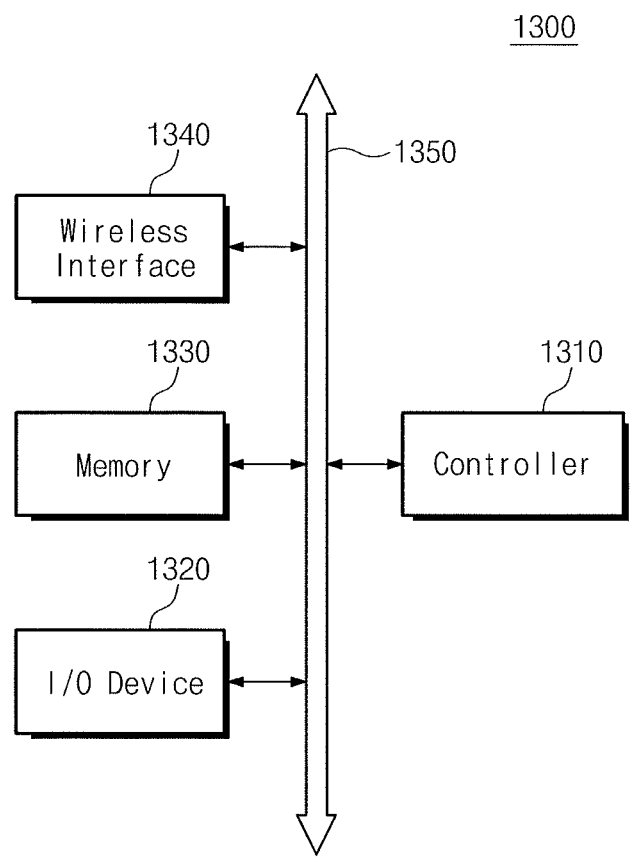
FIGS. 41 and 42 illustrate block diagrams schematically showing electronic devices including a variable resistance memory device according to exemplary embodiments.
Figure 42:
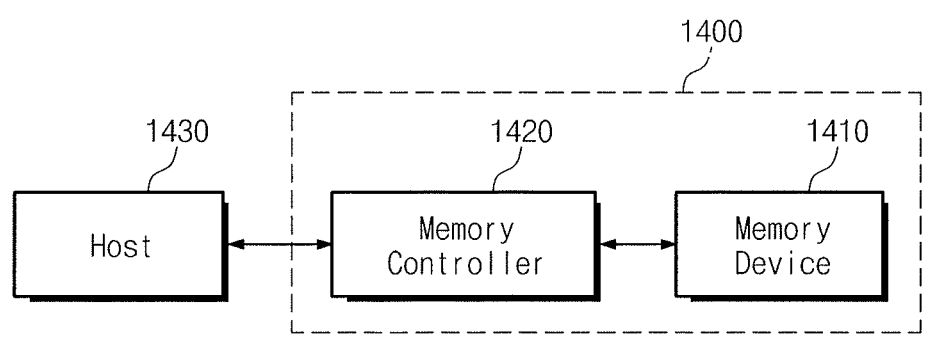

FIGS. 41 and 42 illustrate block diagrams schematically showing electronic devices including a variable resistance memory device according to exemplary embodiments.

Referring to FIG. 41, an electronic device 1300 including a variable resistance memory device according to exemplary embodiments may be used in a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 (such as a keypad, a keyboard, a display, etc.) a memory 1330, and a wireless interface 1340 that are combined to each other through a bus 1350. The controller 1310 may include, e.g., at least one of a microprocessor, a digital signal process, a microcontroller, and the like. The memory 1330 may be configured to store a command code to be used by the controller 1310 and/or a user data. The memory 1330 may include a variable resistance memory device according to exemplary embodiments.

The electronic device 1300 may use a wireless interface 1340 configured to transmit data and/or receive data from a wireless communication network using a RF signal. The wireless interface 1340 may include, e.g., an antenna, a wireless transceiver, etc. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, etc.

Referring to FIG. 42, a memory system including a variable resistance memory device according to exemplary embodiments will be described. The memory system 1400 may include a memory device 1410 for storing huge amounts of data and a memory controller 1420. The memory controller 1420 controls the memory device 1410 so as to read data stored in the memory device 1410 and/or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a variable resistance memory device according to exemplary embodiments.

The variable resistance memory devices disclosed above may be encapsulated using various and diverse packaging techniques. For example, the variable resistance memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and a wafer-level processed stack package (WSP) technique.

The package in which the variable resistance memory device, according to one of the above embodiments, is mounted may further include at least one semiconductor device (e.g., a controller and/or a logic device) that controls the variable resistance memory device.

By way of summation and review, a method of forming a memory device includes sequentially forming layers of horizontal electrodes one by one, and then, forming a vertical electrode (e.g., including a RRAM material and an electrode material) to penetrate the horizontal electrodes. However, the number of patterning steps used to form the horizontal electrodes increases as the number of layers of the horizontal electrodes increases, which may be unfavorable due to technical difficulties and/or economical cost. Further, during the operations of forming each layer of the horizontal electrodes, there may be problems of misalignment and/or difference in size among the different layers of the horizontal electrodes.

In contrast, embodiments relate to a variable resistance memory device having an increased integration density and an improved method of forming the same. For example, embodiments relate to providing methods capable of maintaining a same dimension, forming the horizontal electrodes at one time, and separating the memory elements from each other in a vertical direction.

According to exemplary embodiments, portions of a variable resistance layer interposed between word lines may be removed to reduce a leakage current. For example, variable resistance patterns may be provided within localized regions between the word lines and a vertical electrode adjacent thereto. Accordingly, it may be possible to reduce the possibility of and/or prevent a data disturbance from occurring between adjacent memory cells. Further, the variable resistance patterns may be vertically spaced apart from each other, and this enables an increase in a breakdown voltage of the memory cell.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a selection transistor on a substrate, the selection transistor including a first doped region and a second doped region;
a vertical electrode coupled to the first doped region of the selection transistor;
a bit line coupled to the second doped region of the selection transistor;
a plurality of word lines stacked on the substrate along a sidewall of the vertical electrode;
variable resistance patterns between the word lines and the vertical electrode; and
an insulating isolation layer between the word lines, the variable resistance patterns being spaced apart from each other in a direction normal to a top surface of the substrate by the insulating isolation layer.

2. The device as claimed in claim 1, wherein:
the word lines include a first word line and a second word line that are located at a same level from the top surface of the substrate and that are spaced apart from each other with the vertical electrode interposed therebetween, and
the variable resistance patterns include first and second variable resistance patterns that are adjacent to the first and second word lines, respectively, and that are separated from each other.

3. The device as claimed in claim 1, wherein a dielectric constant of the insulating isolation layer is less than a dielectric constant of the variable resistance patterns.

4. The device as claimed in claim 1, further comprising, a bit line plug coupling the bit line with the second doped region, the bit line plug being electrically separated from the word lines by the insulating isolation layer.

5. The device as claimed in claim 1, further comprising:
a bit line plug coupling the bit line with the second doped region; and
a first insulating layer between the bit line plug and the word lines, the insulating isolation layer being in contact with the first insulating layer.

6. The device as claimed in claim 1, wherein the sidewall of the vertical electrode has recess regions between the variable resistance patterns, the insulating isolation layer extending into the recess regions.

7. The device as claimed in claim 1, further comprising a protection insulating layer between the vertical electrode and the variable resistance patterns, the protection insulating layer extending between the insulating isolation layer and the vertical electrode.

8. The device as claimed in claim 1, further comprising device isolation layers defining active regions of the substrate, wherein:
the first doped region is one of a plurality of first doped regions,
the second doped region is one of a plurality of second doped regions, and
the first doped regions and the second doped regions are alternatingly arranged between the device isolation layers.

9. The device as claimed in claim 1, wherein the variable resistance patterns include at least one selected from the group of a chalcogenide compound, a material that exhibits magneto-resistance characteristics, a perovskite compound, and a transition metal oxide.

* * * * *